US007265602B2

(12) United States Patent
Utsuno

(10) Patent No.: US 7,265,602 B2
(45) Date of Patent: Sep. 4, 2007

(54) VOLTAGE GENERATING CIRCUIT WITH TWO RESISTOR LADDERS

(75) Inventor: Kikuo Utsuno, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/433,356

(22) Filed: May 15, 2006

(65) Prior Publication Data

US 2006/0202744 A1 Sep. 14, 2006

Related U.S. Application Data

(62) Division of application No. 10/885,776, filed on Jul. 8, 2004, now Pat. No. 7,053,690.

(51) Int. Cl.
*H03K 17/62* (2006.01)

(52) U.S. Cl. ........................................ 327/407; 327/534

(58) Field of Classification Search ................ 327/308, 327/403, 404, 405, 407, 408, 411, 530, 534
See application file for complete search history.

(56) References Cited

U.S. PATENT DOCUMENTS 6,570,560 B2 5/2003 Hashimoto
2002/0175904 A1 11/2002 Matsumoti
2003/0006979 A1 1/2003 Tsuchi et al.

FOREIGN PATENT DOCUMENTS

JP 2002-353792 12/2002
JP 2003-022056 1/2003

*Primary Examiner*—Jeffrey Zweizig
(74) *Attorney, Agent, or Firm*—Volentine & Whitt, P.L.L.C.

(57) ABSTRACT

A voltage generating circuit that drives multiple output terminals in alternating positive and negative cycles has two resistor ladders, one resistor ladder generating voltages for the positive cycles, the other resistor ladder generating voltages for the negative cycles. Single-ended amplifiers are connected directly to the resistor ladders, and a switching circuit connects each output terminal to a selectable one of the amplifiers. The output terminals may be precharged to opposite potentials at the beginning of positive and negative cycles, and the resistor ladders may include switching elements that initially set all generated voltages to these potentials so that the amplifiers start each cycle with equal input and output levels, reducing overshoot and undershoot. This voltage generating circuit saves space and power in driving, for example, a display panel in a mobile telephone.

8 Claims, 19 Drawing Sheets

VOLTAGE GENERATING CIRCUIT WITH TWO RESISTOR LADDERS

CROSS REFERENCE TO RELATED APPLICATIONS

This is a divisional application of application Ser. No. 10/885,776, filed Jul. 8, 2004, now U.S. Pat. No. 7,053,690, which is hereby incorporated by reference in its entirety for all purposes.

BACKGROUND OF THE INVENTION

1. Field of the Invention

The present invention relates to a voltage generating circuit useful for generating voltages required by, for example, a thin-film-transistor liquid crystal display (TFT-LCD) panel.

2. Description of the Related Art

TFT-LCD panels are used in mobile telephones, to name just one of many applications. The thin-film transistors in a TFT-LCD panel are field-effect transistors through which data signal voltages representing picture element intensity levels or gray levels are applied to capacitors that store charge in proportion to the gray level. The data signal voltages are carried to the source electrodes of the thin-film transistors by source lines (also referred to as data lines) in the TFT-LCD panel.

The data signal voltages are conventionally generated by a resistor ladder and output onto the source lines through a switching circuit that includes a separate voltage-follower amplifier for each source line. A consequent problem is that if the number of source lines is increased to improve the resolution of the display, the number of amplifiers increases proportionally. For a high-resolution display, the numerous amplifiers take up considerable space and consume considerable power.

A second problem is that each amplifier must be capable of generating the full range of output voltages that might be needed on the source line. One known solution to this problem is to use rail-to-rail amplifiers of the push-pull type, but this type of amplifier draws substantial current whenever its output changes, exacerbating the power consumption problem. Another known solution is to use two single-ended amplifiers for each source line, one amplifier operating in the upper half of the output range and the other amplifier operating in the lower half of the output range, and select one amplifier or the other by, for example, comparing the data signal voltage with a reference voltage, but this scheme doubles the number of amplifiers, further increasing the required amount of space, and the comparators or other means that select the amplifiers take up still further space and consume additional power.

The second problem becomes especially troublesome in the alternating-current (ac) driving scheme that is frequently used to improve the response of a TFT-LCD. In one conventional ac driving scheme, the direction of current flow through the resistor ladder is reversed at regular intervals, by reversing the voltages supplied to the two ends of the ladder. Consequently, even when image data values do not change, the amplifiers must deal with frequent large input and output voltage swings, with attendant problems of overshoot, undershoot, and offset. When push-pull amplifiers are used, these large voltage swings are also accompanied by large unwanted transient flows of current through the push-pull output stage.

Another problem with the conventional ac driving scheme is the need to provide switches for switching the voltages supplied to the resistor ladder, and means for controlling the switches.

SUMMARY OF THE INVENTION

An object of the present invention is to reduce the number of amplifiers in a voltage generating circuit.

Another object of the present invention is to reduce power consumption by a voltage generating circuit operating in an ac driving scheme.

Another object is to reduce overshoot in an ac driving scheme.

Another object is to reduce undershoot in an ac driving scheme.

Another object is to reduce offset in an ac driving scheme.

The invented voltage generating circuit operates in an ac driving scheme in which positive cycles alternate with negative cycles. The voltage generating circuit has a first resistor ladder with a plurality of taps for output of voltages required in the positive cycles, a first plurality of amplifiers with input terminals connected directly to the taps of the first resistor ladder, a second resistor ladder with a plurality of taps for output of voltages required in the negative cycles, a second plurality of amplifiers with input terminals connected directly to the taps of the second resistor ladder, and a switching circuit. The amplifiers have single-ended output stages. The switching circuit selectively supplies the amplifier outputs to a plurality of output terminals. During positive cycles, the selected outputs are obtained from the first plurality of amplifiers. During negative cycles, the selected outputs are obtained from the second plurality of amplifiers. The output from a single amplifier may be supplied to an arbitrary number of output terminals.

The number of amplifiers in the invented generating circuit therefore depends only on the number of taps in the resistor ladders, and not on the number of output terminals. If the output terminals are connected to the source lines of a TFT-LCD panel, for example, the number of output terminals (source lines) is typically greater than the number of taps, so the invented voltage generating circuit requires fewer amplifiers than a conventional voltage generating circuit.

The voltage generating circuit preferably includes a precharging circuit that precharges the output terminals and their connected signal lines to a first potential at the beginning of positive cycles and to a second potential at the beginning of negative cycles, the first potential being higher than the second potential. The first and second potentials may also be supplied to the two ends of each resistor ladder. The first resistor ladder preferably includes a switching element for halting supply of the second potential during negative cycles and during the precharging interval at the beginning of positive cycles. The second resistor ladder preferably includes a switching element for halting supply of the first potential during positive cycles and during the precharging interval at the beginning of negative cycles. The first plurality of amplifiers then start each positive cycle with inputs and outputs identically at the first potential, and the second plurality of amplifiers start each negative cycle with inputs and outputs identically at the second potential. During a positive cycle the outputs of the first plurality of amplifiers fall to levels determined by the first resistor ladder, discharging the connected output terminals to these levels. During a negative cycle the outputs of the second plurality of amplifiers rise to levels determined by the second resistor ladder, charging the connected output terminals to these levels. The initial equality of the amplifier inputs and outputs reduces overshoot, undershoot, and offset, ensuring that the output terminals are brought to the correct output levels.

DETAILED DESCRIPTION OF THE INVENTION

Figure 1:
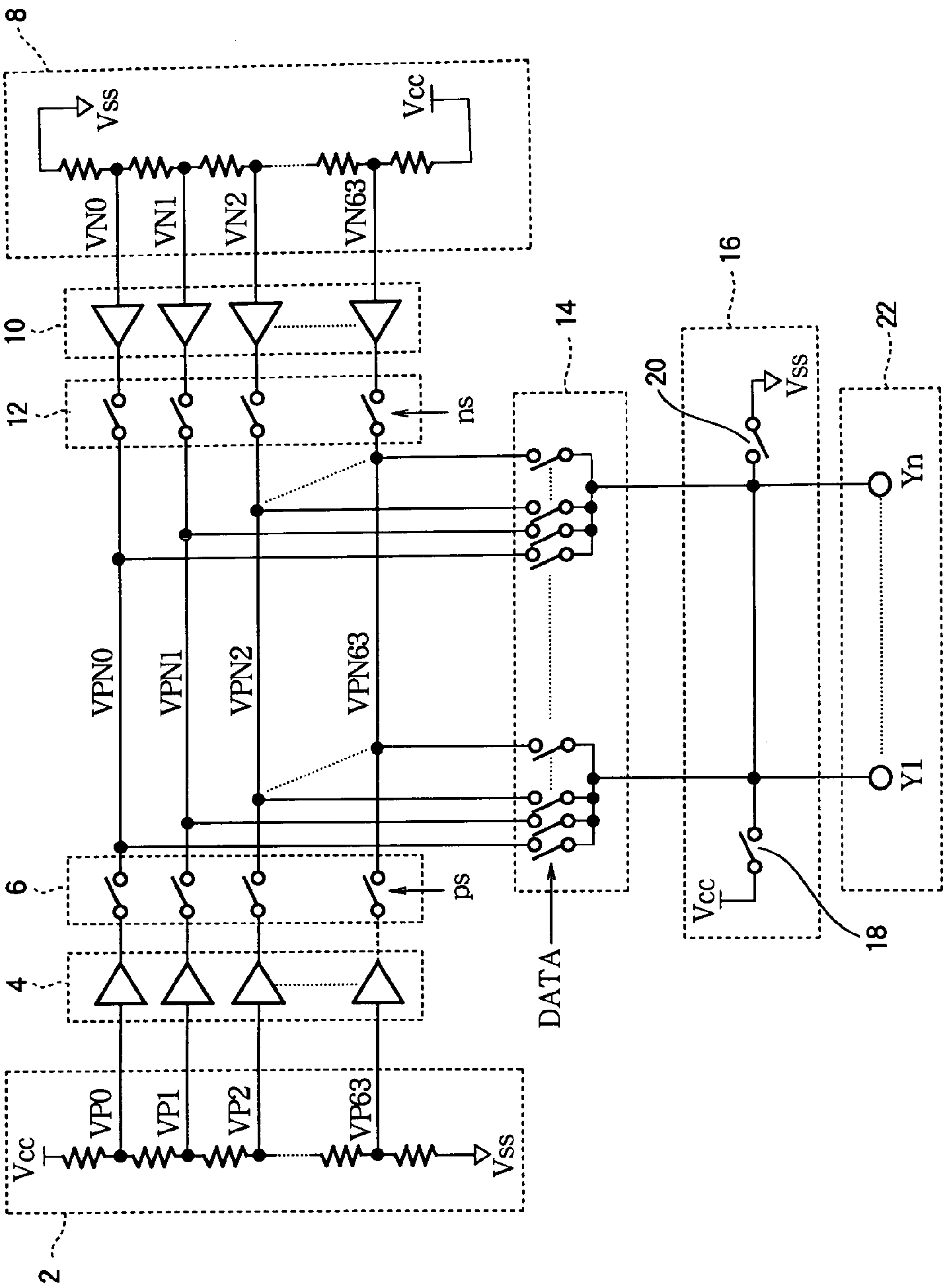
FIG. 1 is a schematic diagram of voltage generating circuit according to a first embodiment of the invention.

Embodiments of the invention will now be described with reference to the attached drawings, in which like elements are indicated by like reference characters.

Referring to FIG. 1, a first embodiment of invention is a voltage generating circuit comprising a first resistor ladder 2, a first plurality of amplifiers 4, a first plurality of analog switches 6, a second resistor ladder 8, a second plurality of amplifiers 10, a second plurality of analog switches 12, an output switching circuit 14, a precharging circuit 16 including a pair of switches 18, 20, and a plurality of output terminals 22. In the following description it will be assumed that the output terminals 22, denoted Y1 to Yn, are connected to the source lines of a TFT-LCD panel having a horizontal resolution of n picture elements (pixels), where n is an arbitrary integer greater than one.

The first resistor ladder 2 receives a first potential Vcc at one end and a second potential Vss at another end, and has sixty-four taps from which voltages VP0 to VP63 intermediate between Vcc and Vss are output. VP0 is relatively close to the Vcc potential, and VP63 is relatively close to the Vss potential. For a TFT-LCD panel employing an ac driving scheme, VP0 to VP63 correspond to a gray scale of pixel intensities following a gamma correction curve used during positive driving cycles. The resistors constituting the first resistor ladder 2 may be formed as resistors, or as transistors with suitable on-state resistance values.

The first plurality of amplifiers 4 comprises sixty-four voltage-follower amplifiers having first input terminals connected directly to the sixty-four taps of the first resistor ladder 2 and output terminals connected to the first plurality of analog switches 6. These amplifiers also have second (inverting) input terminals to which the amplifier output is fed back, but for simplicity, the second input terminals and feedback signal lines are not shown in FIG. 1. The voltages output by the amplifiers are nominally the same as the input voltages (VP0-VP63).

The first plurality of analog switches 6 comprises sixty-four analog switches that operate in unison to connect the output terminals of the first plurality of amplifiers 4 to sixty-four internal signal lines VPN0 to VPN63. VP0 is output on internal signal line VPN0 and VP63 on internal signal line VPN63. The first plurality of analog switches 6 are controlled by a positive cycle selection signal ps.

The second resistor ladder 8, second plurality of amplifiers 10, and second plurality of analog switches 12 are similar to the first resistor ladder 2, first plurality of amplifiers 4, and first plurality of analog switches 6. The second resistor ladder 8 receives Vss and Vcc at its two ends, and generates sixty-four voltages VN0 to VN63, of which VN0 is relatively close to Vss and VN63 is relatively close to Vcc. These voltages are coupled through the second plurality of amplifiers 10 and second plurality of analog switches 12 to the internal signal lines VPN0 to VPN63, with VN0 going to signal line VPN0 and VN63 going to signal line VPN63. The switches in the second plurality of analog switches 12 are controlled by a negative cycle selection signal ns.

The output switching circuit 14 comprises a plurality of switches that selectively connect each of the output terminals 22 to one of the internal signal lines VPN0 to VPN63. These switches are controlled according to image data supplied in a digital image signal. In any given driving cycle, a single internal signal line may be connected to any number of output terminals, from zero to n.

The switches 18, 20 in the precharging circuit 16 can supply either the first potential Vcc or the second potential Vss to all of the output terminals 22, to precharge the signal lines connected to the output terminals.

The amplifiers in the first plurality of amplifiers 4 and second plurality of amplifiers 10 have single-ended output stages capable of driving all n output terminals 22 and their connected signal lines, if necessary. That is, each amplifier is capable of charging or discharging all n output terminals to a predetermined voltage level during one driving cycle. Details of the amplifier circuits and other circuits in FIG. 1 will be shown in later drawings.

The driving cycles are alternately positive and negative. A driving cycle corresponds to, for example, the time needed to drive one row of pixels in the TFT-LCD panel. In a positive driving cycle, the data signal voltages are positive with respect to the common voltage supplied to the common electrodes (not shown in the drawings) of the TFT-LCD panel. In a negative driving cycle, the data signal voltages are negative with respect to the common voltage. The image data supplied to the output switching circuit 14 typically change in synchronization with the change of cycles. The common voltage may also change, e.g., from Vss or a voltage near Vss in positive cycles to Vcc or a voltage near Vcc in negative cycles.

At the beginning of a positive driving cycle, all of the analog switches 6, 12 are in the non-conducting state or off state, the first switch 18 in the precharging circuit 16 is in the conducting state or on state, and the second switch 20 in the precharging circuit 16 is in the off state. The switches in the output switching circuit 14 are controlled by image data so that each of the output terminals 22 is connected to one of the internal signal lines VPN0 to VPN63. The plurality of output terminals 22 and their connected signal lines, including the internal signal lines VPN0 to VPN63, are thereby precharged to the Vcc potential.

Next, the first switch 18 in the precharging circuit 16 is switched off and all of the first plurality of analog switches 6 are switched on. The voltages VP0 to VP63 generated by the first resistor ladder 2 are thereby supplied through the first plurality of amplifiers 4 to the internal signal lines VPN0 to VPN63. Each output terminal Yi (i=1 to n) receives one of these voltages VP0 to VP63, as selected by the output switching circuit 14.

At the end of the positive cycle, the first plurality of analog switches 6 are switched off and the second switch 20 in the precharging circuit 16 is switched on to begin a negative cycle. The plurality of output terminals 22 and their connected signal lines, including the internal signal lines VPN0 to VPN63, are now precharged to the Vss potential.

Next, the second switch 20 in the precharging circuit 16 is switched off and all of the second plurality of analog switches 12 are switched on, supplying the voltages VN0 to VN63 generated by the first resistor ladder 2 through the second plurality of amplifiers 10 to the internal signal lines VPN0 to VPN63. Each output terminal Yi (i=1 to n) receives one of these voltages VN0 to VN63, as selected by the output switching circuit 14.

At the end of the negative cycle, the second plurality of analog switches 12 are switched off, the first switch 18 is switched on, and the next positive cycle begins.

Regardless of the number (n) of output terminals 22, the first embodiment has one hundred twenty-eight amplifiers. For a TFT-LCD display panel in a mobile telephone, for example, n is typically greater than one hundred, so in comparison with a conventional voltage generating circuit having two single-ended amplifiers per output terminal, the first embodiment requires far fewer amplifiers. Nor is it necessary to provide comparators or other means to select the amplifier to use for each output terminal in each cycle. By reducing the number of amplifiers and eliminating the amplifier selection means found in the conventional voltage generating circuit, the present invention saves space and reduces power consumption.

The present invention also reduces power consumption as compared with a conventional voltage generating circuit having push-pull amplifiers, as will be explained later.

Although the present invention requires two resistor ladders 2, 8, since the amplifiers 4, 10 are connected directly to the resistor ladders, the parasitic capacitances associated with the interconnections between the resistor ladders and the amplifiers are comparatively small. The resistance values in the resistor ladders can therefore be comparatively high, reducing the current drawn by the resistor ladders, so the use of two resistor ladders need not lead to extra power consumption.

Figure 2:
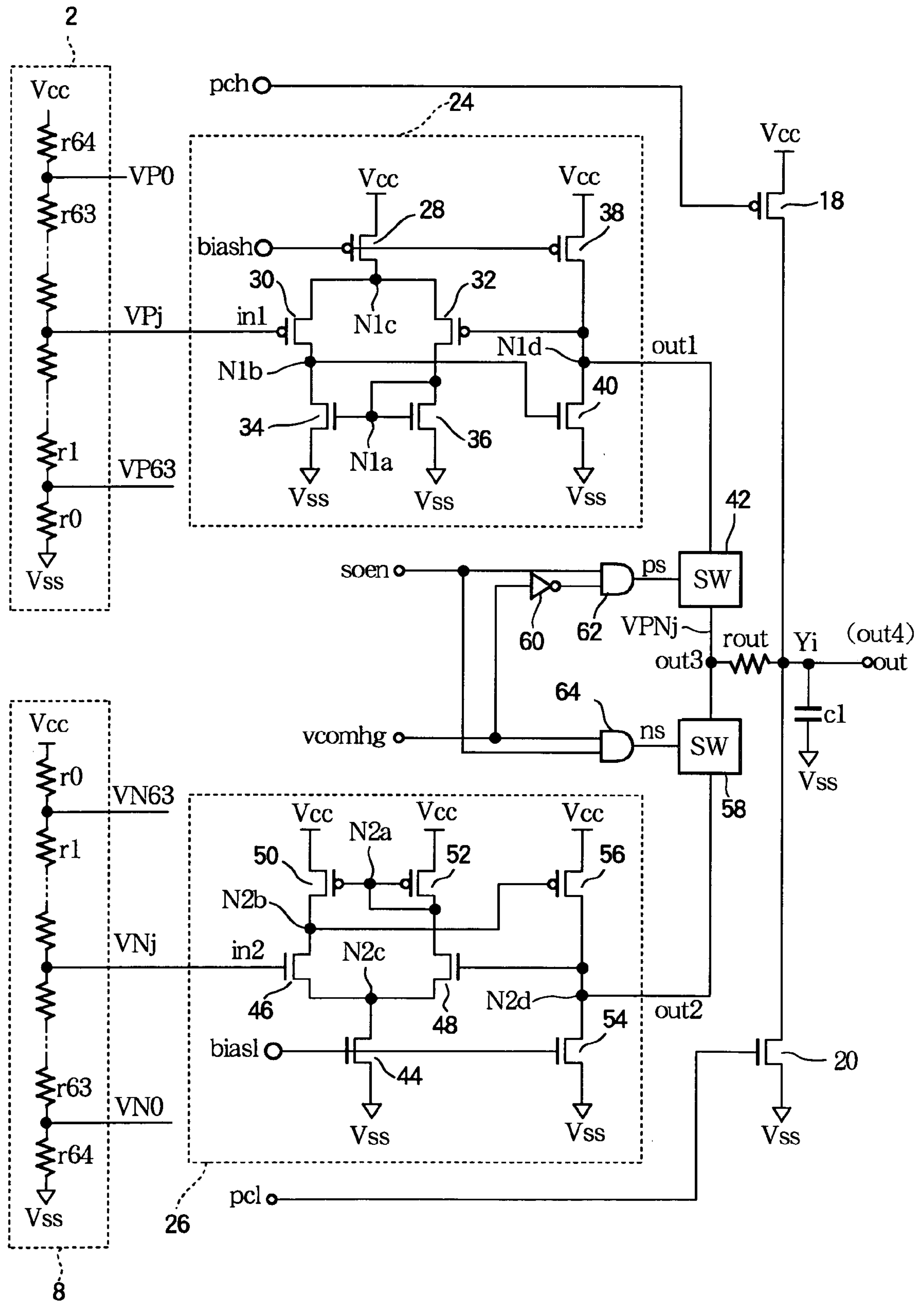
FIG. 2 is a circuit diagram illustrating the internal structure of the amplifiers and the control logic of the analog switches in FIG. 1.

FIG. 2 shows an example of the internal structure of the amplifiers in FIG. 1, showing a first amplifier 24 in the first plurality of amplifiers and a second amplifier 26 in the second plurality of amplifiers. Both amplifiers 24, 26 are connected to the same internal signal line VPNj, where j is an arbitrary integer from 0 to 63. Also shown in FIG. 2 are the corresponding switches in the first plurality of analog switches 6 and second plurality of analog switches 12, the switches 18, 20 in the precharging circuit, and various circuit elements that were not shown in FIG. 1, including the control logic for the analog switches. For simplicity, the output switching circuit 14 is omitted from FIG. 2; the internal signal line VPNj is shown as if it were connected directly to an output terminal Yi, where i is an arbitrary integer from 1 to n.

The resistors r0 to r64 in the first resistor ladder 2 divide the potential difference between Vcc and Vss to generate voltages VP0 to VP63. Resistor r0 is disposed at the Vss end of the ladder, resistor r64 is disposed at the Vcc end, and the other resistors are connected in sequence between these two resistors. VP0 is obtained from the node or tap at which resistors r64 and r63 are interconnected; VP63 is obtained from the node or tap at which resistors r0 and r1 are interconnected.

The second resistor ladder 8 has similar resistors r0 to r64 that divide the potential difference between Vcc and Vss in the opposite direction, resistor r0 being disposed at the Vcc end and resistor r64 at the Vss end. Corresponding resistors in the first and second resistor ladders have the same resistance values: for example, resistor r0 in the first resistor ladder 2 and resistor r0 in the second resistor ladder 8 have the same resistance. VN0 is obtained from the tap between resistors r63 and r64, and VN63 from the tap between resistors r0 and r1.

The taps in the resistor ladders 2, 8 are arranged so that all the output voltages VP0-VP63 and VN0-VN63 obtained are lower than Vcc and higher than Vss. This feature enables the use of single-ended amplifiers.

The amplifiers 24, 26 comprise p-channel metal-oxide-semiconductor (PMOS) and n-channel metal-oxide-semiconductor (NMOS) transistors. As is well known, a PMOS or NMOS transistor has a source electrode, a drain electrode, and a gate electrode. The source and drain electrodes are the main electrodes, at which current is conducted through the transistor. The gate electrode is a control electrode that controls the current flow. The transistor is said to be turned on when it is in the conducting state, and turned off when it is in the non-conducting state.

The first amplifier 24 has a differential amplifying stage comprising PMOS transistors 28, 30, 32 and NMOS transistors 34, 36, and a single-ended output stage comprising a PMOS transistor 38 and an NMOS transistor 40. PMOS transistors 28 and 38 operate as current sources, receiving the first potential Vcc at their source electrodes and a bias signal (biash) at their gate electrodes. The drain electrode of PMOS transistor 28 is connected to the source electrodes of PMOS transistors 30 and 32 at a node N1*c*. The drain electrodes of PMOS transistors 30 and 32 are connected to the drain electrodes of the NMOS transistors 34 and 36, respectively. The drain electrode of PMOS transistor 38 is connected to the drain electrode of NMOS transistor 40; the output signal (out1) of the first amplifier 24 is obtained from an output node N1*d* at which these two drain electrodes are interconnected. The source electrodes of the NMOS transistors 34, 36, 40 receive the second potential Vss. The gate electrode of PMOS transistor 30 (the first input terminal of the amplifier 24) receives voltage VPj from the first resistor ladder 2; this input signal is denoted in1. The gate electrode of PMOS transistor 32 (the second input terminal of the amplifier) is connected to the output node N1*d* and receives the output signal (out1) as feedback. The gate electrodes of NMOS transistors 34 and 36 are both connected at a node N1*a* to the drain electrode of PMOS transistor 32. The gate electrode of NMOS transistor 40 is connected to the drain electrodes of PMOS transistor 30 and NMOS transistor 34 at a node N1*b*.

The output signal (out1) of the first amplifier 24 is supplied to an analog switch (SW) 42, which is one of the first plurality of analog switches 6.

The second amplifier 26 has a complementary structure with a differential stage comprising NMOS transistors 44, 46, 48 and PMOS transistors 50, 52, and a single-ended output stage comprising an NMOS transistor 54 and a PMOS transistor 56. NMOS transistors 44 and 54 operate as current sources, receiving the second potential Vss at their source electrodes and a bias signal (biasl) at their gate electrodes. The drain electrode of NMOS transistor 44 is connected to the source electrodes of PMOS transistors 46 and 48 at a node N2*c*. The drain electrodes of NMOS transistors 46 and 48 are connected to the drain electrodes of the PMOS transistors 50 and 52, respectively. The drain electrode of NMOS transistor 54 is connected to the drain electrode of PMOS transistor 56; the output signal (out2) of the second amplifier 26 is obtained from a node N2*d* at which these two drain electrodes are interconnected. The source electrodes of the PMOS transistors 50, 52, 56 receive the first potential Vcc. The gate electrode of NMOS transistor 46 (the first input terminal of the amplifier 26) receives voltage VNj from the second resistor ladder 8; in the second amplifier 26 this input signal is denoted in2. The gate electrode of NMOS transistor 48 (the second input terminal of the amplifier 26) is connected to the drain electrodes of the transistors 54, 56 in the output stage and receives the output signal (out2) as feedback. The gate electrodes of NMOS transistors 50 and 52 are both connected at a node N2*a* to the drain electrode of NMOS transistor 48. The gate electrode of PMOS transistor 56 is connected to the drain electrodes of NMOS transistor 46 and PMOS transistor 50 at a node N2*b*.

The output signal (out2) of the second amplifier 26 is supplied to an analog switch 58, which is one of the second plurality of analog switches 12.

The logic circuit that controls the analog switches 42, 58 comprises an inverter 60 and a pair of AND gates 62, 64. The inverter 60 receives a positive/negative cycle switching signal (vcomhg). AND gate 64 also receives this signal (vcomhg), while AND gate 62 receives the inverted signal output from the inverter 60. Both AND gates receive an output enable signal (soen). The output of AND gate 62 is the positive cycle selection signal (ps) that controls analog switch 42; the output of AND gate 64 is the negative cycle selection signal (ns) that controls analog switch 58.

The two analog switches 42, 58 are both connected to internal signal line VPNj, the signal output on which is denoted out3. The internal signal line VPNj is connected through the output switching circuit 14 shown in FIG. 1 and through a current-limiting resistor (rout), which was not shown in FIG. 1, to output terminal Yi. The capacitive load at the output terminal Yi is denoted c1, and the signal output at the output terminal Yi is denoted out4.

The first switch 18 in the precharging circuit is a PMOS transistor receiving the first potential Vcc at its source electrode and a positive precharge signal (pch) at its gate electrode. The second switch 20 in the precharging circuit is an NMOS transistor receiving the second potential Vss at its source electrode and a negative precharge signal (pcl) at its gate electrode. The drain electrodes of these transistors 18, 20 are both connected to the output signal line at a point between the current-limiting resistor (rout) and the output terminal (Yi).

Figure 3:
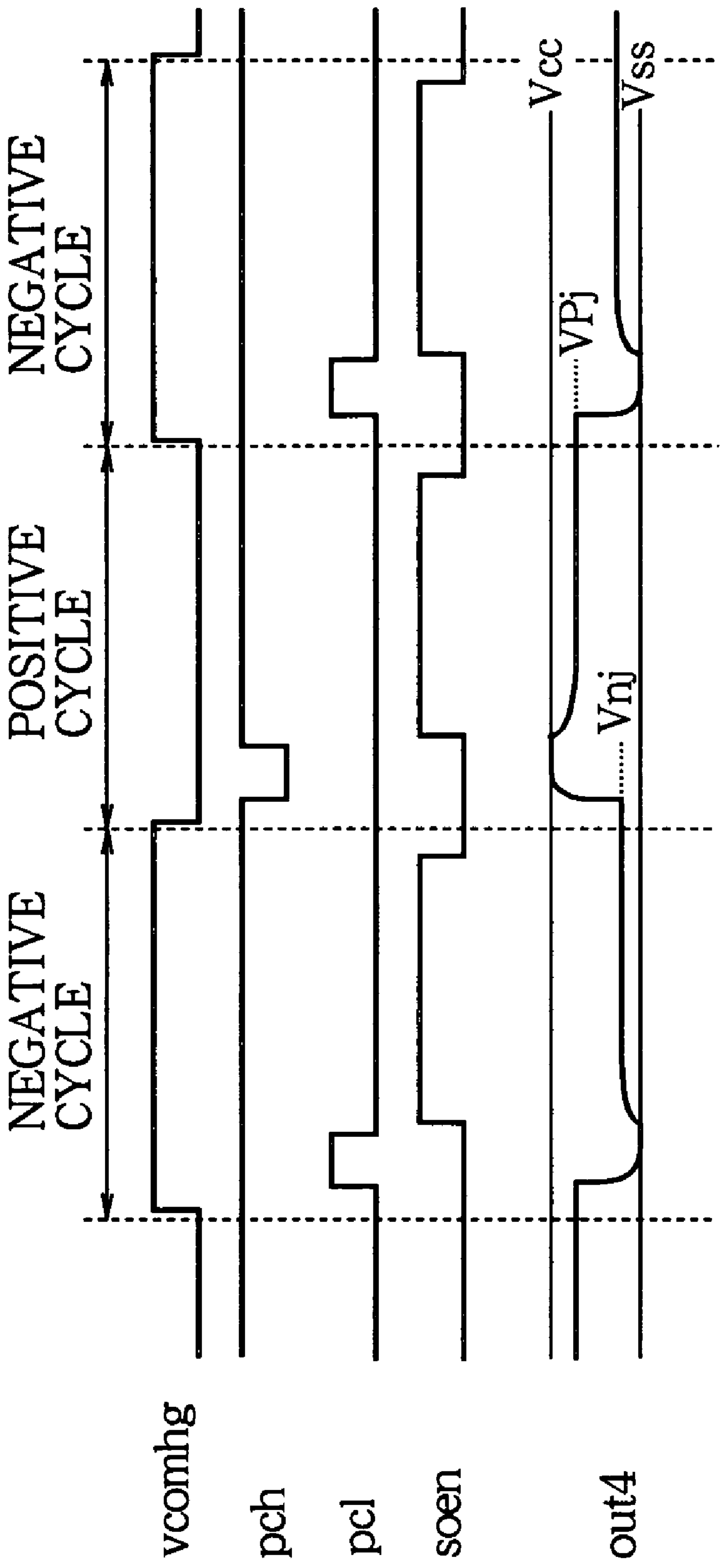
FIG. 3 is a timing waveform diagram illustrating the operation of the first embodiment.

FIG. 3 shows timing waveforms of the positive/negative cycle switching signal (vcomhg), the precharge signals (pch, pcl), the output enable signal (soen), and the signal (out4) obtained at the output terminal. The positive/negative cycle switching signal (vcomhg) is high during negative driving cycles and low during positive driving cycles. The output connections are assumed not to change during the cycles illustrated, so that output terminal Yi alternately receives the VNj and VPj potentials.

Near the beginning of a negative driving cycle, the negative precharge signal (pcl) goes high to turn on NMOS transistor 20 and precharge (discharge) the output terminal Yi and its connected signal lines to the Vss level. The negative precharge signal (pcl) remains high long enough for the output signal (out4) to reach Vss regardless of its previous level, then goes low, turning off NMOS transistor 20. At the same time, the output enable signal (soen) goes high. Both inputs (vcomhg and soen) to AND gate 64 are now high, so the ns signal (not shown) output by AND gate 64 goes high, turning on analog switch 58 and supplying the output (out2) of the second amplifier 26 to the output terminal Yi. The output signal (out4) at the output terminal Yi accordingly rises to the VNj level, where it is held by negative feedback in the second amplifier 26. Near the end of the negative driving cycle, the output enable signal (soen) returns to the low level and analog switch 58 is turned off, disconnecting the output terminal Yi from the second amplifier 26.

Near the beginning of a positive driving cycle, the positive precharge signal (pch) goes low to turn on PMOS transistor 18 and precharge the output terminal Yi and its connected signal lines to the Vcc level. The precharge signal (pch) remains low long enough for the output signal (out4) to reach Vcc regardless of its previous level, then goes high, turning off PMOS transistor 18. At the same time, the output enable signal (soen) goes high. Both inputs (the inverted vcomhg signal and soen) to AND gate 62 are now high, so the ps signal (not shown) output by AND gate 62 goes high, turning on analog switch 42 and supplying the output (out1) of the first amplifier 24 to the output terminal Yi. The output signal (out4) at the output terminal Yi accordingly falls to the VPj level and is held there by negative feedback in the first amplifier 24. Near the end of the negative driving cycle, the output enable signal (soen) returns to the low level and analog switch 42 is turned off, disconnecting the output terminal Yi from the first amplifier 24.

In the circuit configuration shown in FIG. 2, a small amount of current flows from Vcc to Vss through the output stages of the amplifiers 24, 26 at all times, but the dimensions of the output-stage current source transistors 38, 54 and the levels of the bias signals (biash, biasl) can be set so that this current flow is on the order of one microampere 1 u A. In a conventional voltage generating circuit of the type using a single resistor ladder and push-pull amplifiers, each time the inputs to the resistor ladder are reversed to switch between positive and negative driving cycles, a transient current considerably larger than 1 u A flows through the push-pull output stages before the amplifiers settle into their new output states. More generally, a large transient current flows whenever the output state changes. This transient current flow occurs because the output stage of a push-pull amplifier comprises, for example, a PMOS transistor and an NMOS transistor connected in series between Vcc and Vss and controlled in complementary fashion by the outputs of the differential stage of the amplifier. The present invention eliminates these undesired transient currents, thereby reducing power consumption.

Another advantage of the circuit configuration in FIG. 2 is that the outputs (out1 and out2) of the amplifiers 24, 26 remain constant over both positive and negative driving cycles, eliminating the overshoot and undershoot that occur in each cycle in conventional voltage generating circuits.

The present invention also eliminates the need for switching circuitry to switch the resistor ladder inputs.

Since each amplifier may have to drive up to n output terminals and their connected signal lines, the present invention is best suited to applications in which n is not too large, as in the display panel of a mobile telephone. Since the present invention reduces the number of amplifiers and eliminates undesired transient currents, it is ideally suited for a device such as a mobile telephone, in which space is at a premium and battery charge must be conserved.

Figure 4:
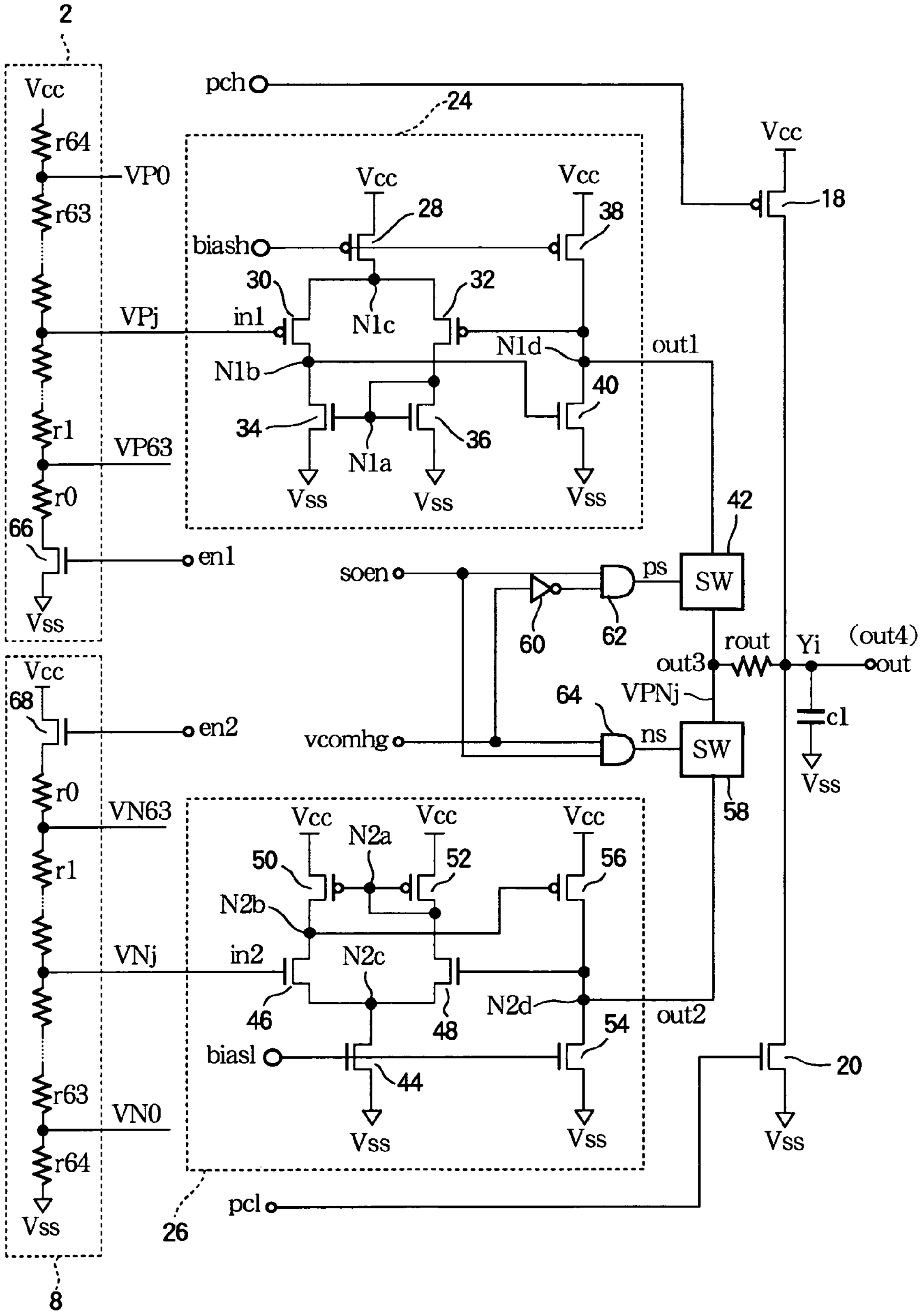
FIG. 4 is a circuit diagram illustrating a variation of the first embodiment.

FIG. 4 illustrates a variation of the first embodiment in which switching elements are added to the resistor ladders. Specifically, an NMOS transistor 66 is inserted between resistor r0 and Vss in the first resistor ladder 2, and a PMOS transistor 68 is inserted between resistor r0 and Vcc in the second resistor ladder 8. A first resistor ladder enable signal (en1) is supplied to the gate electrode of NMOS transistor 66, and a second resistor ladder enable signal (en2) is supplied to the gate electrode of NMOS transistor 68.

Figure 5:
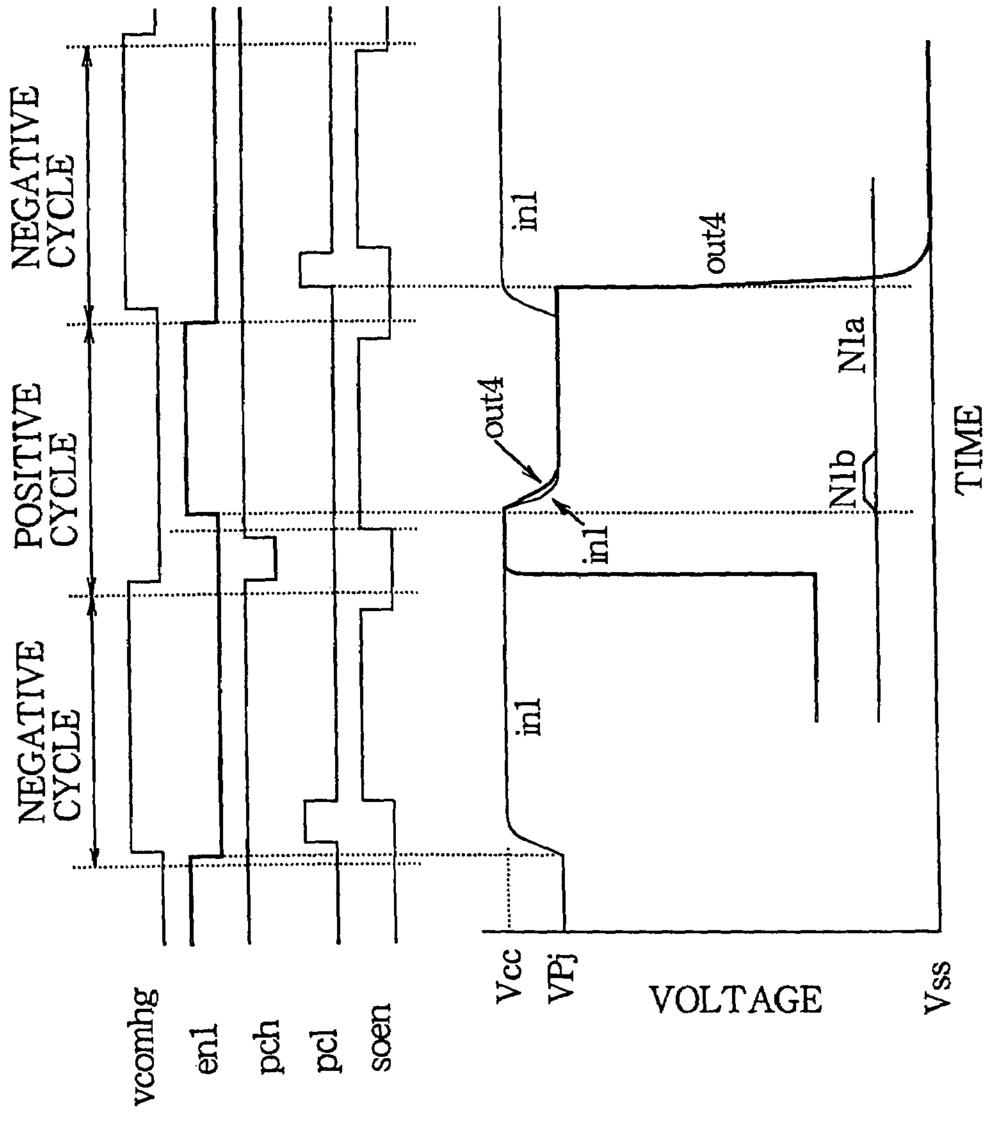
FIG. 5 is a timing waveform diagram illustrating the operation of the variation in FIG. 4.

Referring to FIG. 5, the first resistor ladder enable signal (en1) is driven high in each positive driving cycle, after the output enable signal (soen) has gone high. The first resistor ladder enable signal (en1) then returns to the low level near the end of the positive driving cycle, after the output enable signal (soen) has gone low, and remains low during each negative driving cycle. Consequently, no current flows through the first resistor ladder 2 during negative driving cycles.

When the output enable signal goes high in a positive driving cycle, since the positive/negative cycle switching signal (vcomhg) is low, analog switch 42 turns on and the Vcc potential of the output signal (out4) is quickly transferred to the output terminal of the first amplifier 24. While the first resistor ladder enable signal (en1) is low, all taps of the first resistor ladder 2 are also at the Vcc level. As a result, when the first resistor ladder enable signal (en1) goes high, the input signal (in1) and output signal (out1) of the first amplifier 24 are both at the same level (Vcc). As current flows through the first resistor ladder 2, the input signal (in1) falls to the VPj level, and the output signals (out1, out3, out4) fall with it as the capacitive load c1 discharges. Because the input and output signals start at the same potential, negative feedback in the first amplifier 24 is able to keep the output potential nearly equal to the input potential, so little or no undershoot occurs, and the final output signal (out4) stabilizes at the desired VPj level.

During this process, since the gate potentials of transistors 30 and 32 remain nearly equal, the current supplied by PMOS transistor 28 is divided nearly equally between the path through transistors 30 and 34 and the path through transistors 32 and 36. The potential at node N1*b* therefore remains nearly equal to the potential of node N1*a*, which remains constant at the threshold level of NMOS transistor 36. Since the output signal (out4) does not fall quite as fast as the input signal (in1), there is an interval in which slightly more current takes the path through transistors 30 and 34, causing the potential at node N1*b* to rise above the potential at node N1*a*, but the rise is slight.

Figure 6:
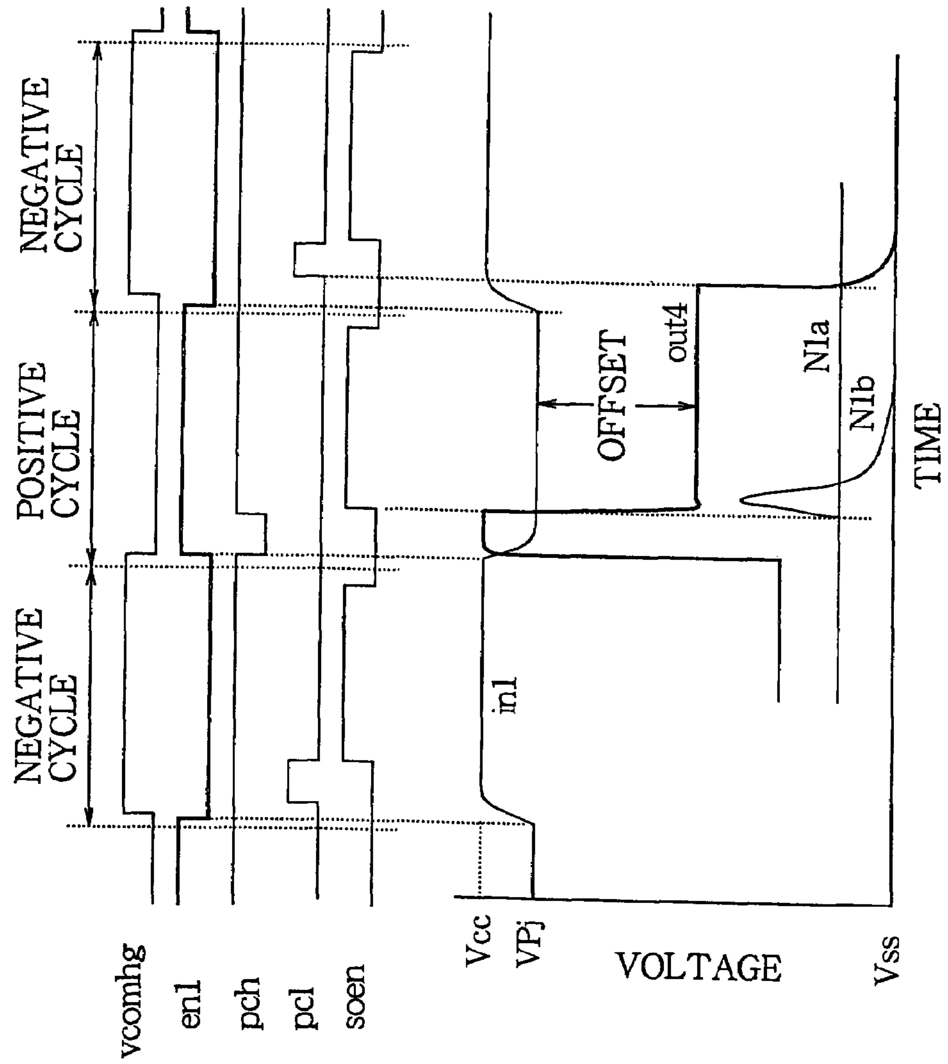
FIG. 6 is a timing waveform diagram modified to illustrate undershoot.

To explain why undershoot is avoided, FIG. 6 shows what would happen if the first resistor ladder enable signal (en1) were to go high when the positive precharge signal (pch) was activated at the beginning of the positive driving cycle. The input signal (in1) of the first amplifier 24 would then fall to the VPj level while the output signal (out4) was being precharged to the Vcc level. When the output enable signal (soen) went high, the input signal (in1) of the first amplifier 24 would be at a significantly lower level than the output signal (out4), causing considerably more current to flow through transistors 30 and 34 than through transistors 32 and 36, and the potential at node N1*b* would rise steeply, bringing the output signal down to a level lower than VPj. That is, the output of the first amplifier 24 would undershoot the target level. The potential at node N1*b* would then fall below the potential at node N1*a*, halting the fall of the output signal, but as the microampere current provided by transistor 38 is too small to charge the capacitive load c1 at a significant rate, the output voltage would stay below the VPj level for the remainder of the positive driving cycle, causing an undesired input-output offset.

Figure 7:
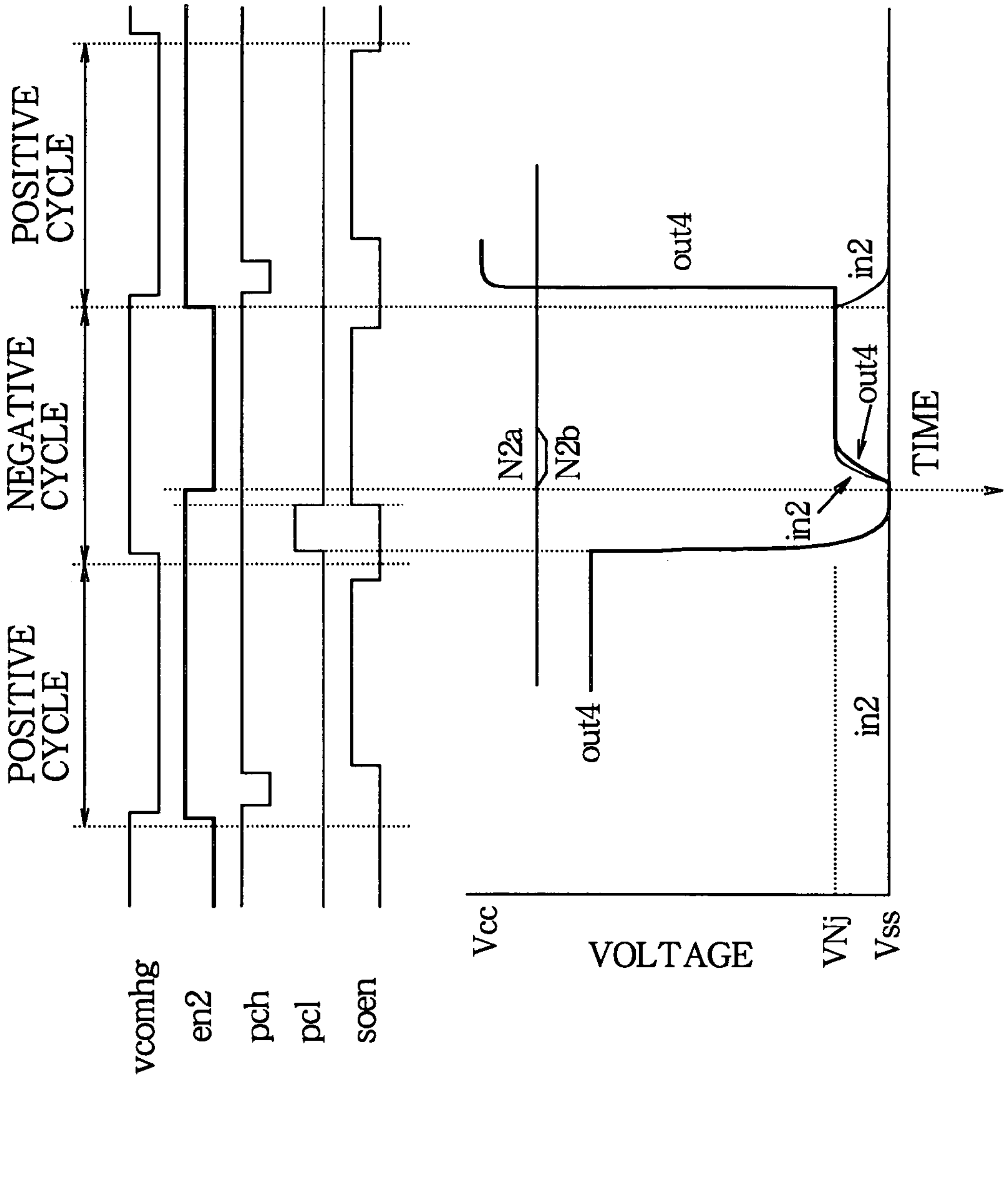
FIG. 7 is another timing waveform diagram illustrating the operation of the variation in FIG. 4.

Referring to FIG. 7, the second resistor ladder enable signal (en2) is driven low in each negative driving cycle, after the output enable signal (soen) has gone high, and returns to the high level near the end of the negative driving cycle, after the output enable signal (soen) goes low, en2 remaining high during each positive driving cycle. Consequently, no current flows through the second resistor ladder 8 during positive driving cycles.

When the output enable signal goes high in a negative driving cycle, the Vss potential of the output signal (out4) is quickly transferred to the output terminal of the second amplifier 26, and when the second resistor ladder enable signal (en2) is high, all taps of the second resistor ladder 8 are at the Vss level. As a result, when the second resistor ladder enable signal (en2) goes low, the input signal (in2) and output signal out1) of the second amplifier 26 are both at the same level (Vss). As current flows through the second resistor ladder 8, the input signal (in2) rises to the VNj level, and the output signals (out1, out3, out4) rise with it as the capacitive load c1 charges. Because the input and output signals start at the same potential, negative feedback in the second amplifier 26 is able to keep them at nearly the same potential, so little or no overshoot occurs, and the final output signal (out4) stabilizes at the desired VNj potential.

During this process, since the gate potentials of transistors 46 and 48 remain nearly equal, the current supplied by PMOS transistor 44 is divided nearly equally between the path through transistors 46 and 50 and the path through transistors 48 and 52, so the potential at node N2*b* remains nearly equal to the potential of node N2*a*, which remains constant at the threshold level of PMOS transistor 52. Since the output signal (out4) does not rise quite as fast as the input signal (in1), there is an interval in which slightly more current takes the path through transistors 46 and 50, causing the potential at node N2*b* to fall below the potential at node N2*a*, but the fall is slight.

Figure 8:
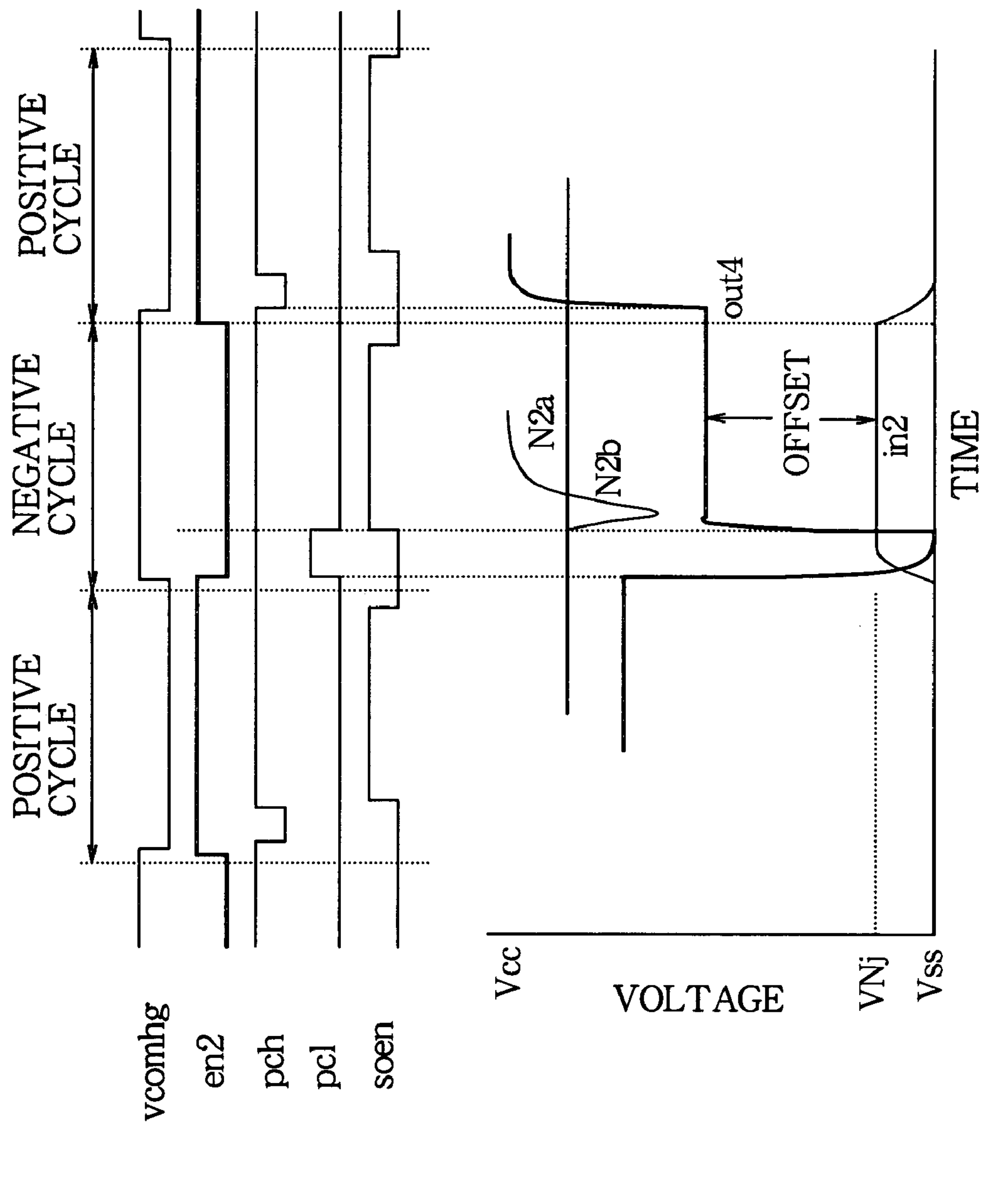
FIG. 8 is a timing waveform diagram modified to illustrate overshoot.

To explain why overshoot is avoided, FIG. 8 shows what would happen if the second resistor ladder enable signal (en2) were to go low when the negative precharge signal (pcl) was activated at the beginning of the negative driving cycle. The input signal (in2) of the second amplifier 26 would then rise to the VNj level while the output signal (out4) was being precharged to the Vss level. When the output enable signal (soen) went high, the input signal (in2) of the second amplifier 26 would be at a significantly higher level than the output signal (out4), causing considerably more current to flow through transistors 46 and 50 than through transistors 48 and 52, and the potential at node N2*b* would fall steeply, bringing the output signal up to a level higher than VNj. That is, the output of the second amplifier 26 would overshoot its target. The potential at node N2*b* would then fall below the potential at node N2*a*, halting the rise of the output signal, but as the current provided by transistor 54 is too small to discharge the capacitive load c1 at a significant rate, the output voltage would stay below the VNj level for the remainder of the negative driving cycle, causing an undesired input-output offset.

By halting current flow through the first resistor ladder 2 during negative driving cycles and through the second resistor ladder 8 during positive driving cycles, the circuit configuration in FIG. 4 reduces the current drawn by the resistor ladders to the same level as if there were only a single resistor ladder.

By ensuring that the amplifier inputs and outputs start at the same level in each driving cycle, the circuit configuration in FIG. 4 reduces overshoot, undershoot, and offset to negligible levels.

Figure 9:
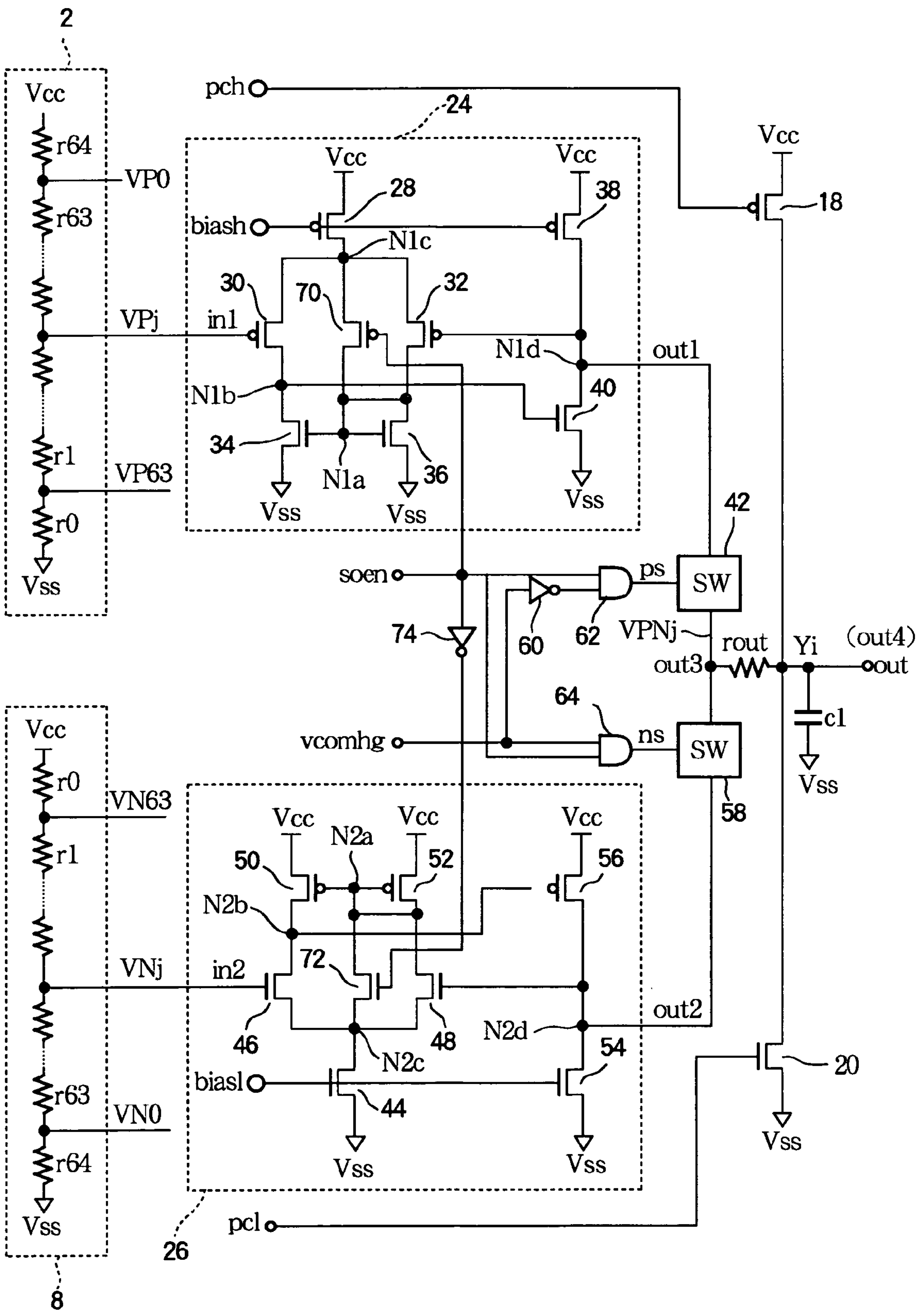
FIG. 9 is a circuit diagram illustrating another variation of the first embodiment.

FIG. 9 illustrates another variation of the first embodiment, obtained by inserting a PMOS transistor 70 between nodes N1*a* and N1*c* in the first amplifier 24 and an NMOS transistor 72 between nodes N2*a* and N2*c* in the second amplifier 26 in FIG. 2, and adding an inverter 74 to invert the output enable signal (soen). The gate electrode of PMOS transistor 70 receives the output enable signal. The gate electrode of PMOS transistor 72 receives the inverted output enable signal from the inverter 74.

Figure 10:
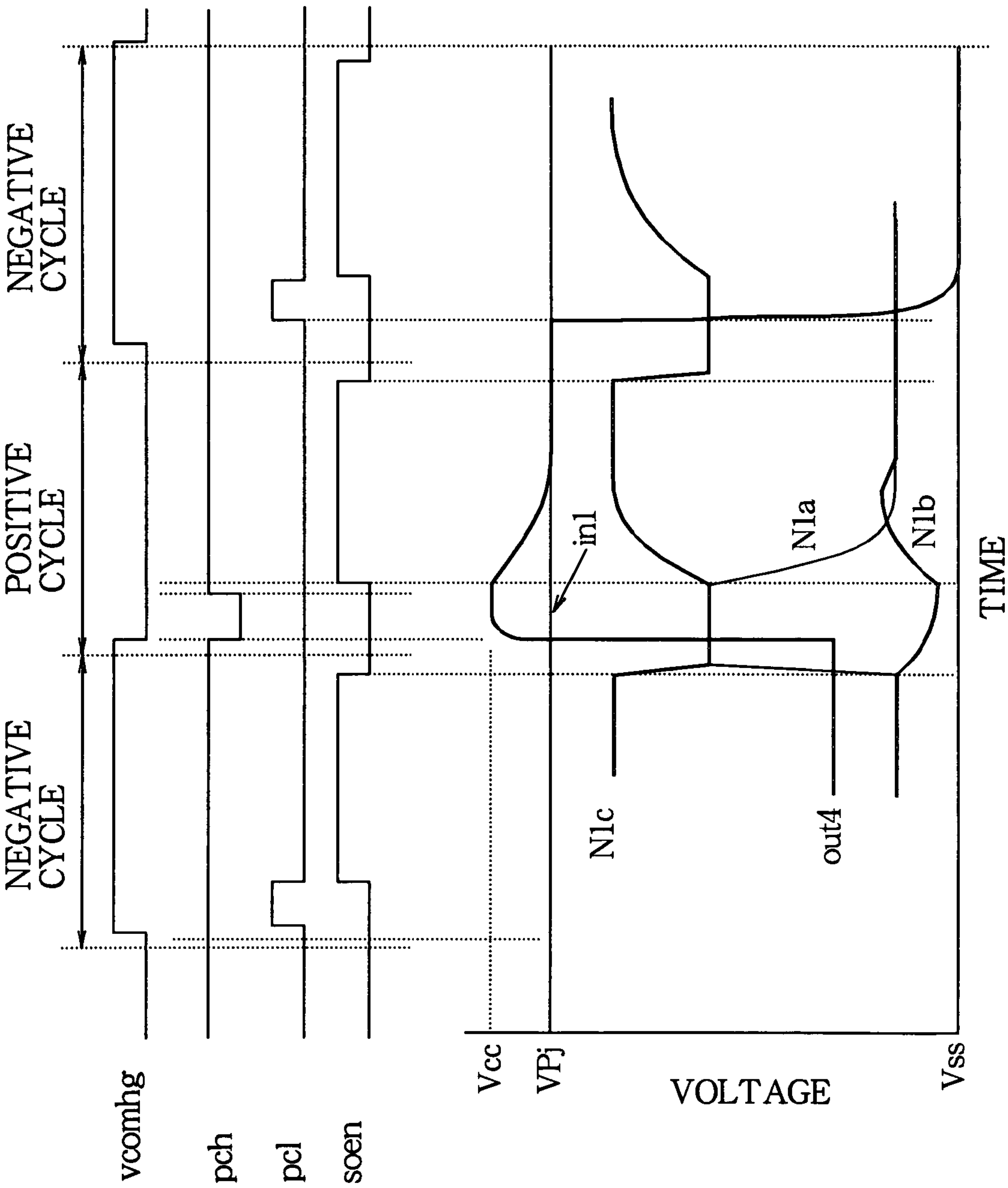
FIGS. 10 and 11 are timing waveform diagrams illustrating the operation of the variation in FIG. 9.

Referring to FIG. 10, when the output enable signal (soen) goes low during the transition interval from a negative driving cycle (vcomhg high) to a positive driving cycle (vcomhg low), PMOS transistor 70 turns on, equalizing the potentials at nodes N1*a* and N1*c*, thereby pulling node N1*a* up to a level higher than its normal constant level. Since additional current flows through transistors 70 and 36, less current is available to take the path through transistors 30 and 34, and the potential at node N1*b* falls. During this transition interval, the positive precharge signal (pch) goes low and the output signal (out4) is precharged to the Vcc level, which is higher than the level (VPj) of the input signal (in1) to the first amplifier 24.

When the output enable signal (soen) goes high, the additional current flow through PMOS transistor 70 is cut off and node N1*a* returns to its normal constant level. At the same time, the output signal out4 begins to fall as the capacitive load c1 discharges through NMOS transistor 40. Since the output potential (Vcc) of the first amplifier 24 is initially higher than its input potential (VPj), the potential of node N1*b* attempts to rise above the normal constant level of the potential at node N1*a*, but because node N1*b* starts out below this normal constant level, by the time node N1*b* reaches a potential only slightly higher than the potential of node N1*a*, the output signal out4 has fallen to a level near the level of the input signal in1. Negative feedback is now able to return the N1*b* potential to the normal level, allowing the output signal (out4) to stabilize at its target level of VPj. Undershoot is thereby avoided and the correct voltage is output for the rest of the positive driving cycle.

Figure 11:
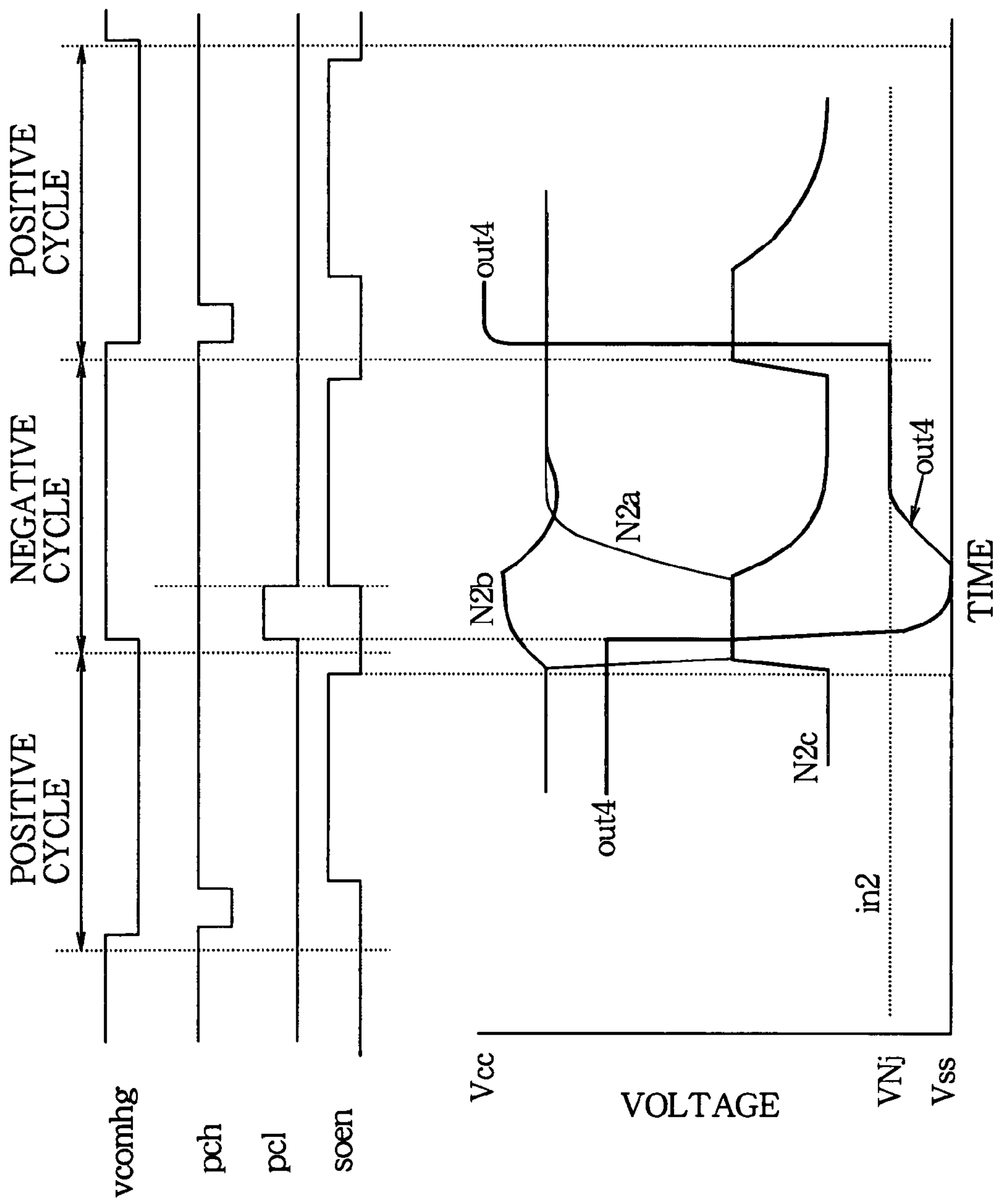

Referring to FIG. 11, when the output enable signal (soen) goes low during the transition interval from a positive driving cycle (vcomhg low) to a negative driving cycle (vcomhg high), NMOS transistor 72 turns on, equalizing the potentials at nodes N2*a* and N2*c* in the second amplifier 26, thereby pulling node N2*a* down below its normal constant level. Since additional current flows through transistors 72 and 52, less current is available to take the path through transistors 46 and 50, and the potential at node N2*b* rises. During this transition interval, the negative precharge signal (pcl) goes high and the output signal (out4) is precharged to the Vss level, which is lower than the level (VNj) of the input signal (in2) to the second amplifier 26.

When the output enable signal (soen) goes high, the additional current flow through NMOS transistor 72 is cut off and node N2*a* returns to its normal constant level. Since the output potential (Vss) of the second amplifier 26 is initially lower than its input potential (VNj), the potential of node N2*b* now attempts to fall below the normal constant level of the potential at node N2*a*, but because node N2*b* starts out above this normal constant level, the potential of node N2*b* is able to reach a potential only slightly below the potential of node N2*a*. Both the N2*a* and N2*b* potentials return to the normal level by about the time the output signal (out4) reaches its target level of VNj. Overshoot is thereby avoided and the correct voltage is output for the rest of the negative driving cycle.

The circuit configuration in FIG. 9 accordingly provides a way to avoid overshoot, undershoot, and offset without the need for additional control signals to switch current in the resistors ladders 2 and 8 on and off.

Figure 12:
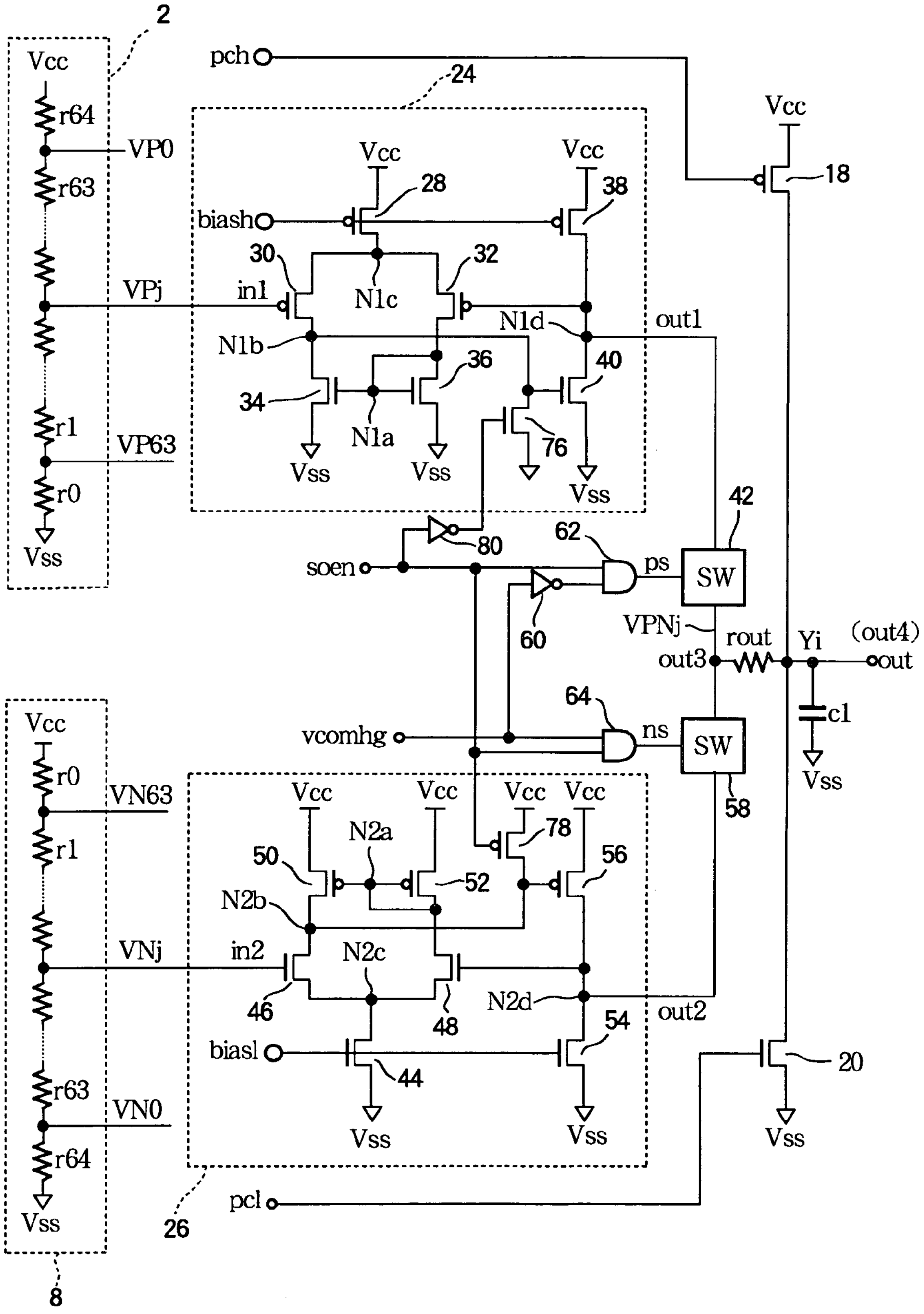
FIG. 12 is a circuit diagram illustrating still another variation of the first embodiment.

FIG. 12 illustrates another variation of the first embodiment, obtained by adding an NMOS transistor 76, a PMOS transistor 78, and an inverter 80 to the circuit configuration in FIG. 2. The inverter 80 inverts the output enable signal (soen). NMOS transistor 76 receives the second potential Vss at its source electrode, receives the inverted output enable signal from the inverter 80 at its gate electrode, and has its drain electrode connected to node N1*b* and the gate electrode of NMOS transistor 40 in the first amplifier 24. PMOS transistor 78 receives the first potential Vcc at its source electrode, receives the output enable signal (soen) at its gate electrode, and has its drain electrode connected to node N2*b* and the gate electrode of PMOS transistor 56 in the second amplifier 26.

Figure 13:
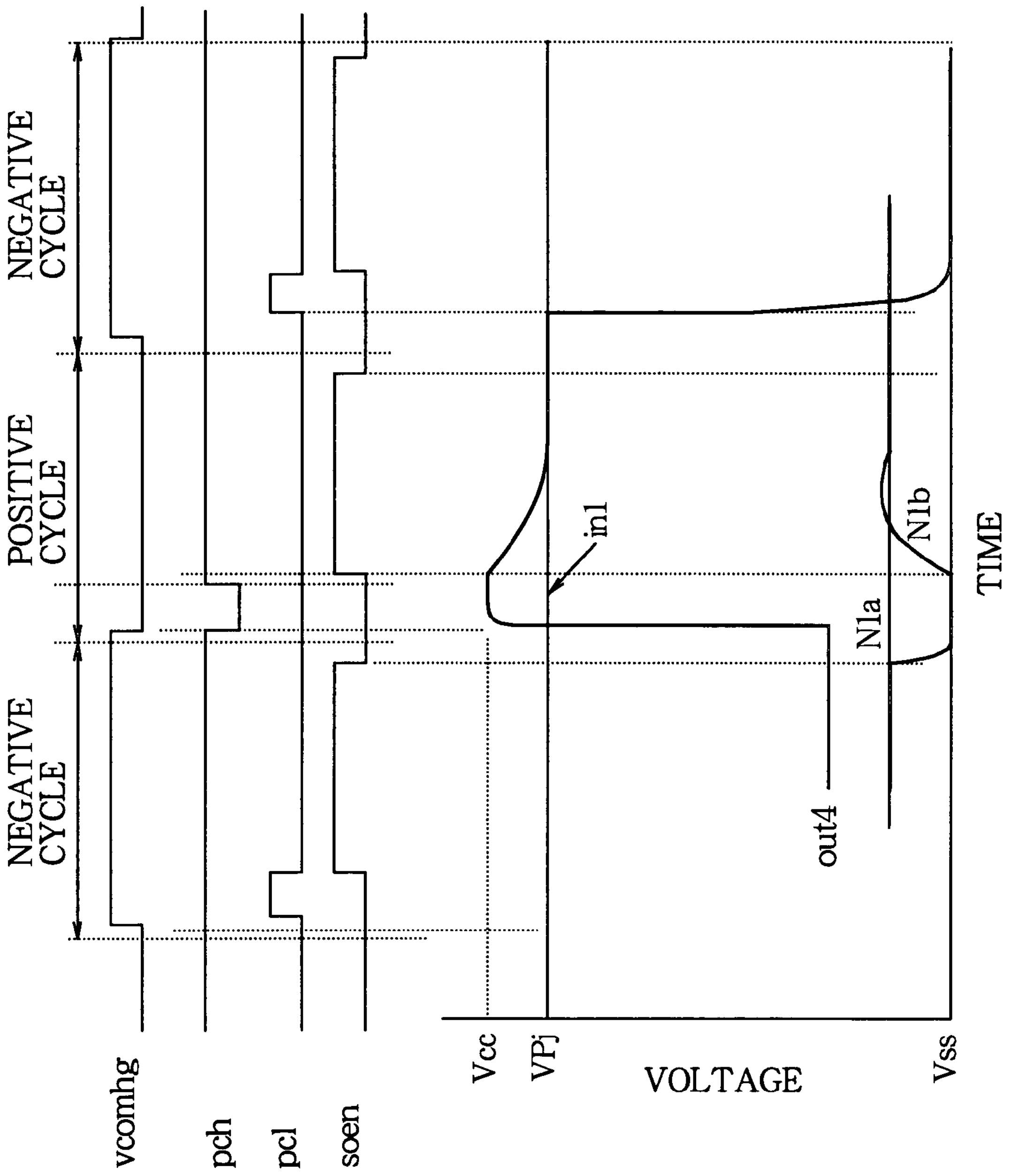
FIGS. 13 and 14 are timing waveform diagrams illustrating the operation of the variation in FIG. 12.

Referring to FIG. 13, when the output enable signal (soen) goes low during the transition interval from a negative driving cycle (vcomhg high) to a positive driving cycle (vcomhg low), NMOS transistor 76 turns on, pulling node N1*b* down to the Vss level. In the meantime, the positive precharge signal (pch) goes low and the signal (out4) at the output terminal is precharged to the Vcc level, which is higher than the level of the input signal (in1) to the first amplifier 24.

When the output enable signal (soen) goes high, NMOS transistor 76 turns off and the potential of node N1*b* begins to rise. As the potential of the output signal is initially higher (Vcc) than the potential (VPj) of the input signal of the first amplifier 24, node N1*b* attempts to rise above the level of the potential at node N1*a*, but since node N1*b* started out at the Vss level, it goes only slightly above the potential of node N1*a* during the approach of the output signal (out4) to the target potential VPj. Negative feedback in the first amplifier 24 is then able to bring the N1*b* potential back to the level of node N1*a*, and the fall of the output signal potential halts at the desired VPj level without undershooting. The VPj voltage is now output correctly for the rest of the positive driving cycle.

Figure 14:
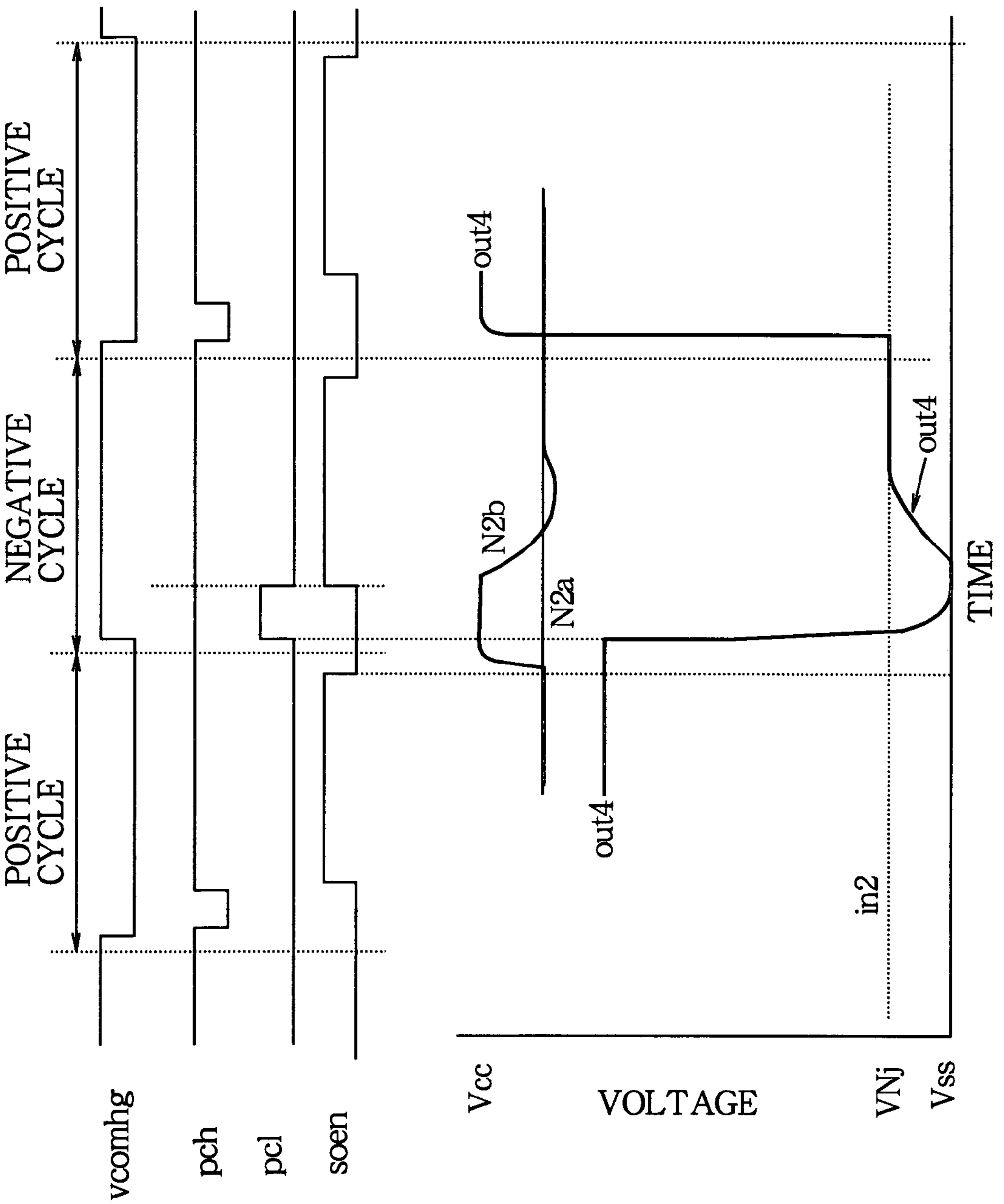

Referring to FIG. 14, when the output enable signal (soen) goes low during the transition interval from a positive driving cycle (vcomhg low) to a negative driving cycle (vcomhg high), PMOS transistor 78 turns on, pulling node N2*b* up to the Vcc level. In the meantime, the negative precharge signal (pcl) goes high and the signal (out4) at the output terminal is precharged to the Vss level, which is lower than the level of the input signal (in1) to the second amplifier 26.

When the output enable signal (soen) goes high, PMOS transistor 78 turns off and the potential of node N2*b* begins to fall. As the potential of the output signal is initially lower (Vcc) than the potential (VNj) of the input signal of the second amplifier 26, node N2*b* attempts to fall below the level of the potential at node N2*a*, but since node N2*b* started out at the Vcc level, it goes only slightly below the potential of node N2*a* during the approach of the output signal (out4) to the target potential VNj. Negative feedback in the second amplifier 26 is then able to bring the N2*b* potential back to the level of node N2*a*, and the rise of the output signal potential halts at the desired VNj level without overshooting. The VNj voltage is now output correctly for the rest of the negative driving cycle.

Figure 15:
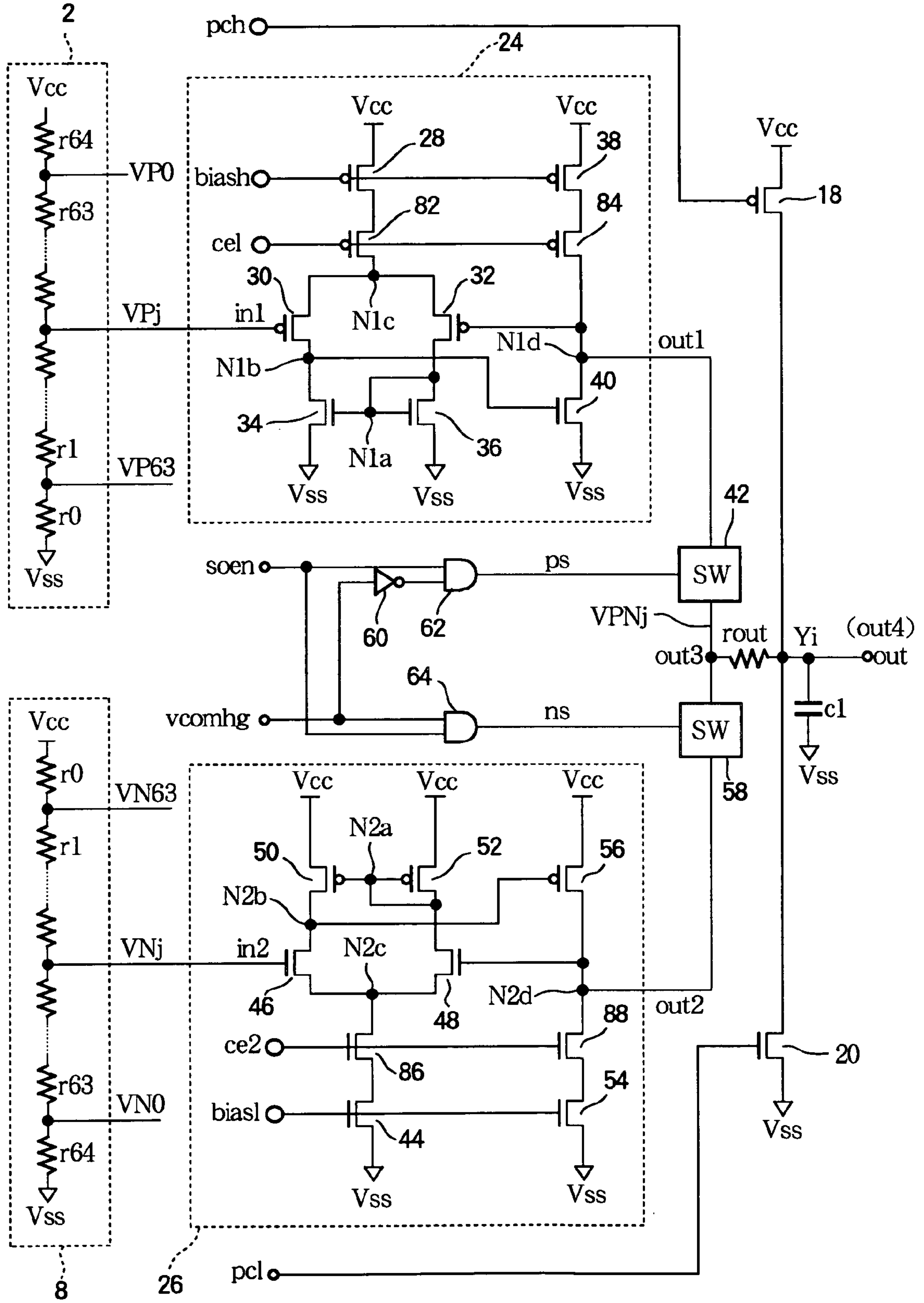
FIG. 15 is a circuit diagram illustrating yet another variation of the first embodiment.

FIG. 15 illustrates a further variation of the first embodiment, obtained by adding pair of PMOS transistors 82, 84 to the first amplifier 24 and a pair of NMOS transistors 86, 88 to the second amplifier 26 in FIG. 2. PMOS transistor 82 is inserted in series between the drain electrode of PMOS transistor 28 and node N1*c*; PMOS transistor 84 is inserted in series between the drain electrode of PMOS transistor 38 and the output node N1*d*. NMOS transistor 86 is inserted in series between the drain electrode of NMOS transistor 44 and node N2*c*; NMOS transistor 88 is inserted in series between the drain electrode of NMOS transistor 54 and the output node N2*d*. The gate electrodes of PMOS transistors 82 and 84 receive a first amplifier enable signal (ce1); the gate electrodes of NMOS transistors 86 and 88 receive a second amplifier enable signal (ce2).

During positive driving cycles, both amplifier enable signals (ce1 and ce2) are low. PMOS transistors 82 and 84 are therefore turned on and the first amplifier 24 operates in the same way as in FIGS. 2 and 3, while NMOS transistors 86 and 88 are turned off, halting current flow through both the differential stage and the output stage of the second amplifier 26.

During negative driving cycles, both amplifier enable signals (ce1 and ce2) are high. PMOS transistors 82 and 84 are therefore turned off, halting current flow through both stages of the first amplifier 24, while transistors 86 and 88 are turned on and the second amplifier 26 operates in the same way as in FIGS. 2 and 3.

By halting unnecessary current flow through the amplifiers, the circuit configuration in FIG. 15 conserves power.

Figure 16:
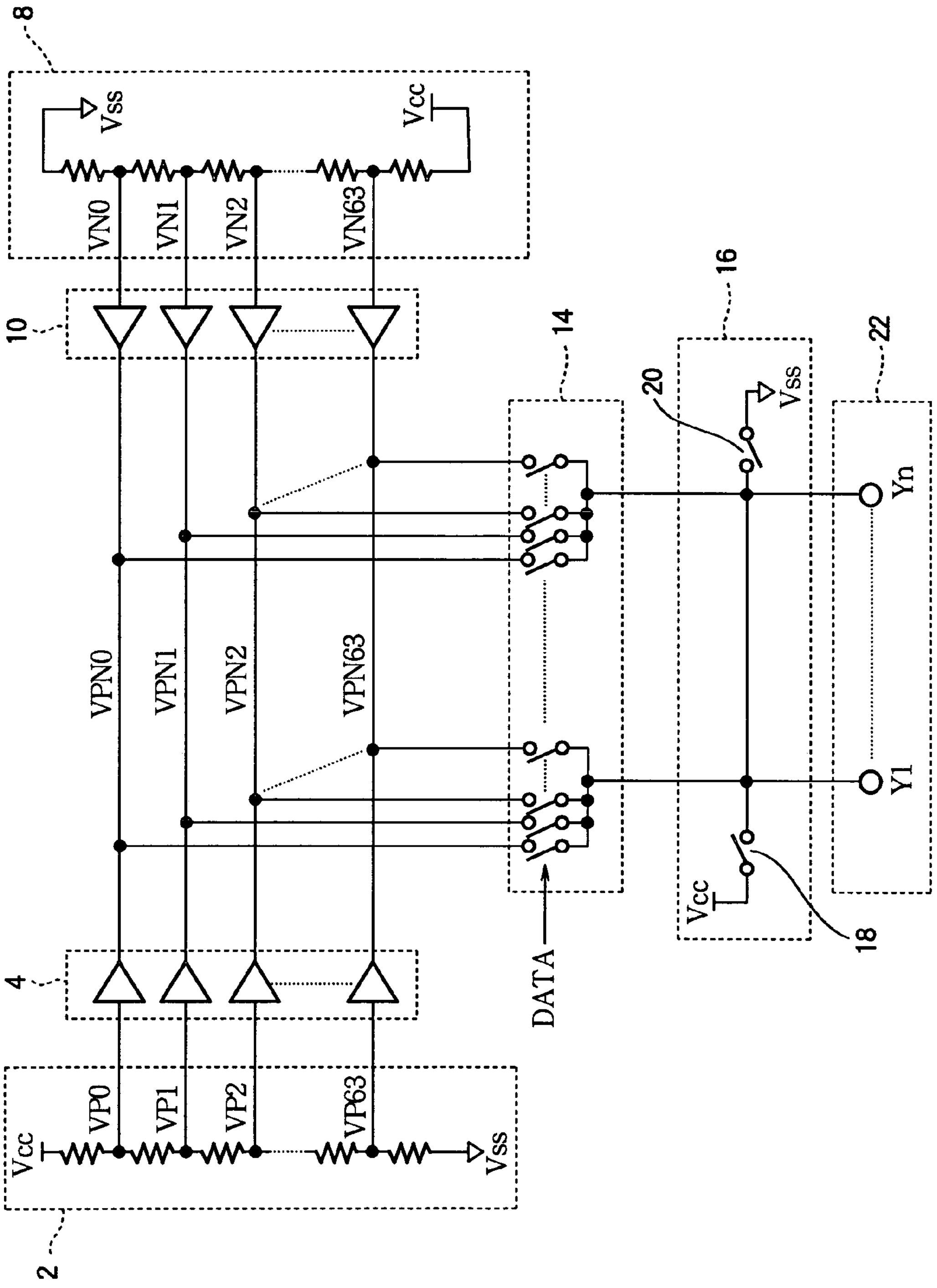
FIG. 16 a schematic diagram of voltage generating circuit according to a second embodiment of the invention.

FIG. 16 illustrates the general circuit configuration of a second embodiment of the invention. This embodiment eliminates the analog switches in FIG. 1 and connects the amplifiers 4, 10 directly to the internal signal lines VPN0-VPN63.

Figure 17:
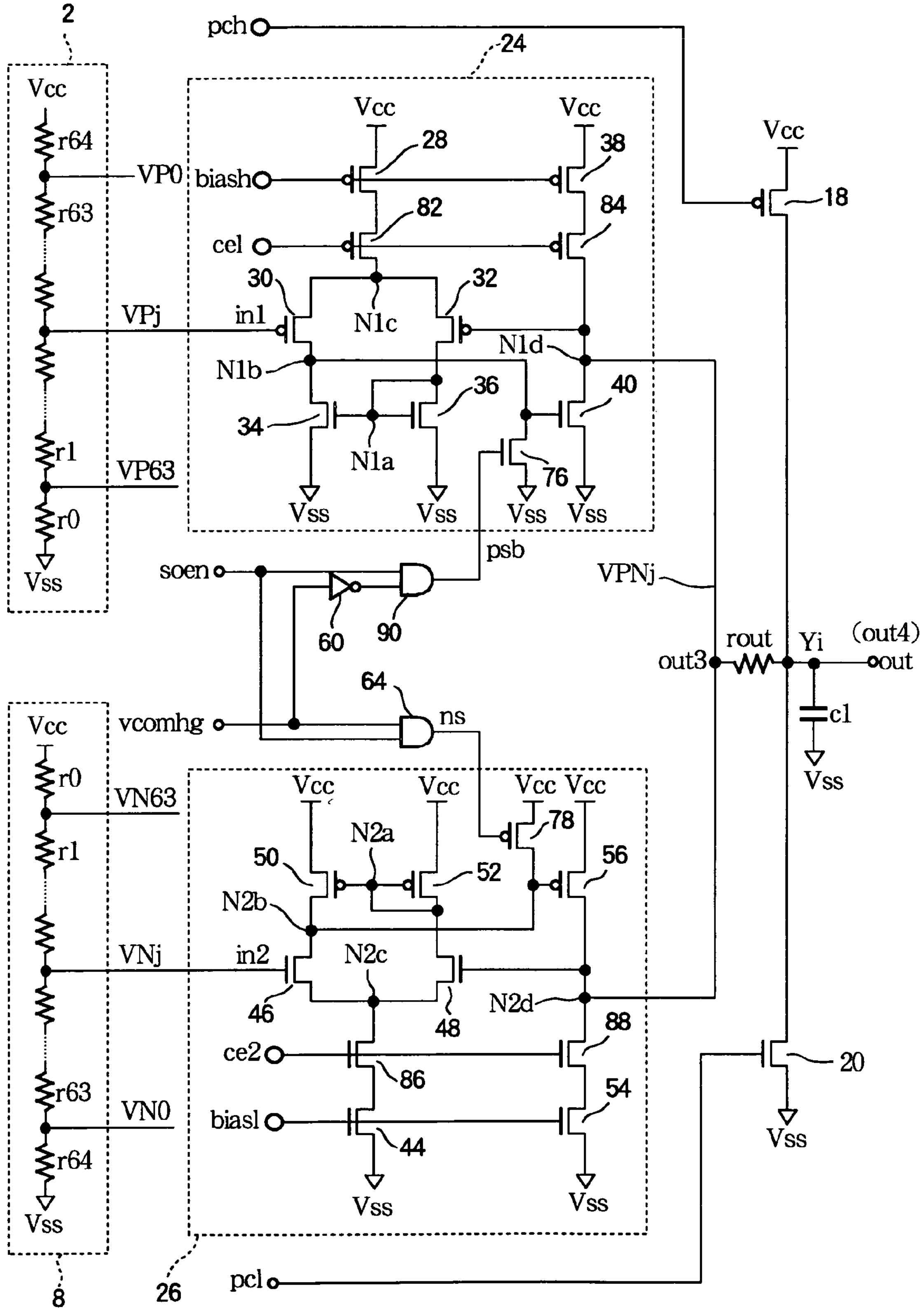
FIG. 17 is a circuit diagram illustrating the internal structure of the amplifiers in FIG. 16 and their control logic.

FIG. 17 illustrates the circuit configuration of the second embodiment in more detail by showing the internal structure of the amplifiers 24, 26 connected to an internal signal line VPNj, where j is an arbitrary integer from 0 to 63. Amplifier 24, which is one of the first plurality of amplifiers 4, combines the features of the first amplifier 24 in FIGS. 12 and 15: that is, it has the basic structure shown in FIG. 2, with additional PMOS transistors 82 and 84 that interrupt current flow during negative driving cycles, and an additional NMOS transistor 76 that turns off NMOS transistor 40 and pulls node N1*b* down to the Vss level during negative driving cycles. Amplifier 26, which is one of the second plurality of amplifiers 10, similarly combines the features of the second amplifier 26 in FIGS. 12 and 15, adding NMOS transistors 86 and 88 and a PMOS transistor 78 to the basic structure shown in FIG. 2, NMOS transistors 86 and 88 interrupting current flow and PMOS transistor 78 turning off PMOS transistor 56 and pulling node N2*b* up to the Vcc level during positive driving cycles.

NMOS transistor 76 and PMOS transistor 78 are controlled by a logic circuit comprising the inverter 60 and AND gate 64 shown in FIG. 2 and a NAND gate 90. The inputs to the NAND gate 90 are the output enable signal (soen) and the inverted positive/negative cycle switching signal (vcomhg) output from the inverter 60. The output terminal of the NAND gate 90 is connected to the gate electrode of NMOS transistor 76 in the first amplifier 24. The inputs to the AND gate 64 are the output enable signal (soen) and the positive/negative cycle switching signal (vcomhg). The output terminal of the AND gate 64 is connected to the gate electrode of PMOS transistor 78 in the second amplifier 26. PMOS transistors 82 and 84 in the first amplifier 24 and NMOS transistors 86 and 88 in the second amplifier 26 are controlled by amplifier enable signals (ce1, ce2) that are high during negative driving cycles and low during positive driving cycles, as in FIG. 15.

During a positive driving cycle, the second amplifier enable signal (ce2) is low, so NMOS transistor 88 is turned off, and the positive/negative cycle switching signal (vcomhg) is low, so the output (ns) of the AND gate 64 is low, PMOS transistor 78 is turned on, and PMOS transistor 56 is turned off. Since NMOS transistor 88 and PMOS transistor 56 are both turned off, the output stage of the second amplifier 26 is in the high-impedance state, and does not affect the potential of the internal signal line VPNj.

Similarly, during a negative driving cycle, PMOS transistor 84 is turned off because the first amplifier enable signal (ce1) is high, and NMOS transistor 40 is turned off because the inverted positive/negative cycle switching signal (vcomhg) output from the inverter 60 is low, making the output (psb) of the NAND gate 90 high and turning on NMOS transistor 76. The output of the first amplifier 24 is accordingly in the high-impedance state and does not affect the potential of the internal signal line VPNj.

Figure 18:
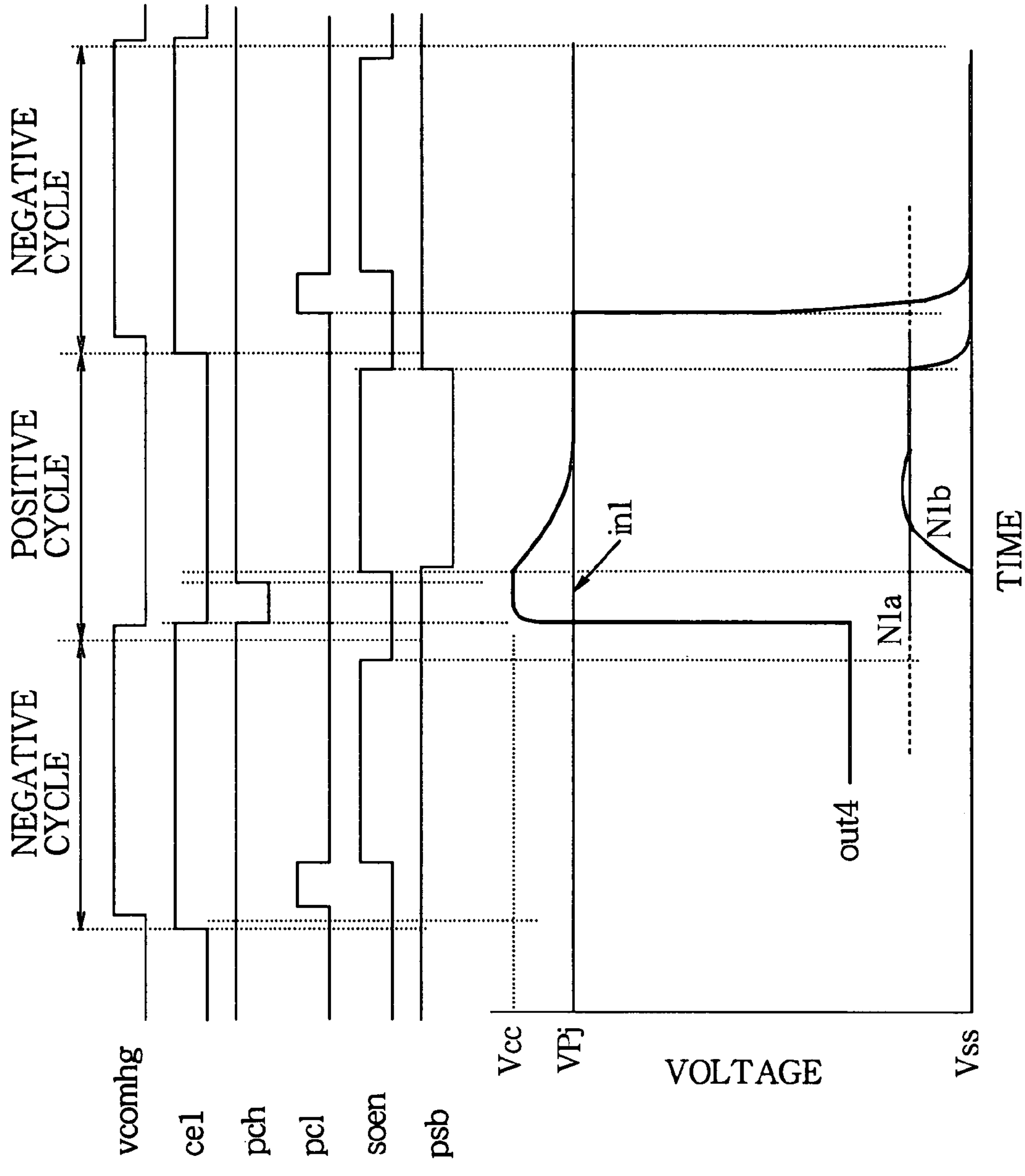
FIGS. 18 and 19 are timing waveform diagrams illustrating the operation of the second embodiment.

Referring to FIG. 18, node N1*b* is held at the Vss level whenever NMOS transistor 76 is turned on, that is, whenever either the positive/negative cycle switching signal (vcomhg) is high or the output enable signal (soen) is low, making the output (psb) of the NAND gate 90 high. During a positive driving cycle, the first amplifier enable signal (ce1) goes low together with the positive/negative cycle switching signal (vcomhg) and the positive precharge signal (pch). As the output signal (out4) at the output terminal is precharged to the Vcc level, current begins to flow through the differential stage of the first amplifier 24, and the potential of node N1*a* stabilizes at the threshold level of NMOS transistor 36. When the output enable signal (soen) goes high, since the inverted positive/negative cycle switching signal (vcomhg) output from the inverter 60 is also high, the output (psb) of the NAND gate 90 goes low, turning off NMOS transistor 76 and allowing the potential of node N1*b* to rise. As in the variation of the first embodiment illustrated in FIGS. 12 and 13, since the potential of node N1*b* starts from Vss, it rises only slightly above the potential of node N1*a*, despite the initially large difference between the input and output potentials of the first amplifier 24, and the output signal (out4) stabilizes at the desired VPj level for the remainder of the positive driving cycle.

Figure 19:
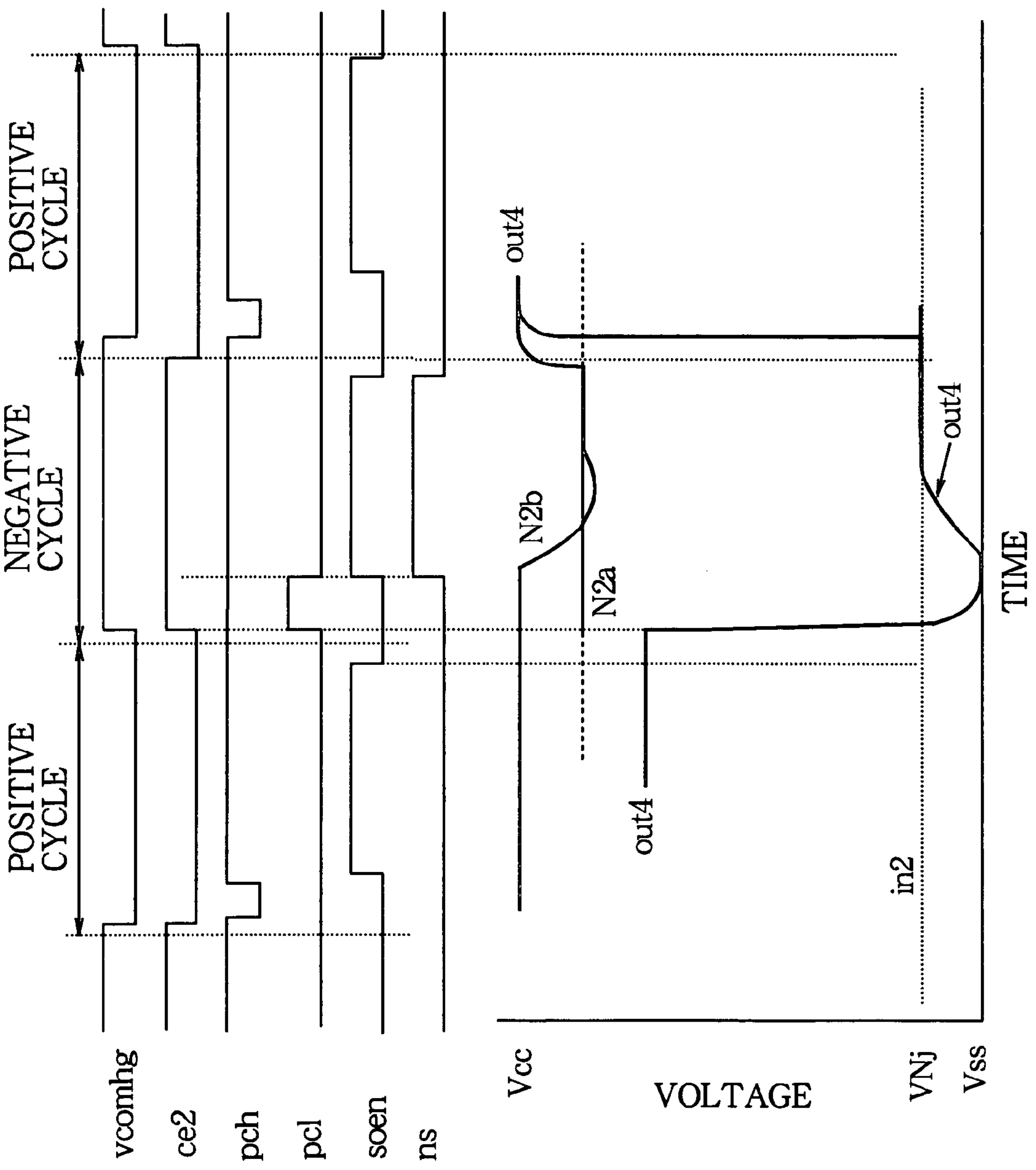

Referring to FIG. 19, node N2*b* is held at the Vcc level whenever PMOS transistor 78 is turned on, that is, whenever either the positive/negative cycle switching signal (vcomhg) is low or the output enable signal (soen) is low, making the output (ns) of the AND gate 64 low. During a negative driving cycle, the second amplifier enable signal (ce2) goes high together with the positive/negative cycle switching signal (vcomhg) and the negative precharge signal (pcl). As the output signal (out4) at the output terminal is precharged to the Vss level, current begins to flow through the differential stage of the second amplifier 26, and the potential of node N2*a* stabilizes at the threshold level of PMOS transistor 52. When the output enable signal (soen) goes high, since the positive/negative cycle switching signal (vcomhg) is also high, the output of the AND gate 64 goes high, turning off PMOS transistor 78 and allowing the potential of node N2*b* to fall. As in FIG. 14, because the potential of node N2*b* starts from Vcc, it falls only slightly below the potential of node N2*a*, despite the initially large difference between the input and output potentials of the second amplifier 26, and the output signal (out4) stabilizes at the desired VNj level for the remainder of the negative driving cycle.

The second embodiment saves circuit space by eliminating the analog switches of the first embodiment, while also preventing overshoot and undershoot of the amplifier outputs and avoiding unwanted voltage offsets.

The second embodiment can be modified by including transistor switching elements in the resistor ladders 2, 8 as shown in FIG. 4.

Those skilled in the art will recognize that further variations are possible within the scope of the invention, which is defined in the appended claims.

What is claimed is:

1. A voltage generating circuit comprising:

a first resistor ladder having a plurality of taps for output of respective voltages;

a first plurality of amplifiers with output stages, having respective first input terminals coupled to respective taps in the first resistor ladder;

a second resistor ladder having a plurality of taps for output of respective voltages;

a second plurality of amplifiers with output stages, having respective first input terminals coupled to respective taps in the second resistor ladder;

a plurality of internal signal lines, a first plurality of switches connected between respective output stages of the first plurality of amplifiers and respective ones of the internal signal lines;

a second plurality of switches connected between respective output stages of the second plurality of amplifiers and respective ones of the internal signal lines;

a plurality of output terminals; and an output switching circuit connected between the internal signal lines and the output terminals.

2. The voltage generating circuit of claim 1, wherein the first plurality of amplifiers and the second plurality of amplifiers have respective second input terminals, the second input terminal of each amplifier receiving feedback of the voltage output by the amplifier, the amplifier thus operating as a voltage follower.

3. The voltage generating circuit of claim 1, wherein the first and second plurality of switches comprise analog switches.

4. The voltage generating circuit of claim 1, wherein the first resistor ladder has a first end receiving a first potential and a second end receiving a second potential, the second resistor ladder also has a first end receiving the first potential and a second end receiving the second potential, and the first potential is higher than the second potential.

5. The voltage generating circuit of claim 4, wherein the first resistor ladder comprises resistance elements with a predetermined sequence of resistance values from the first end to the second end, and the second resistor ladder comprises resistance elements with said predetermined sequence of resistance values from the second end to the first end.

6. The voltage generating circuit of claim 1, further comprising a precharging circuit for precharging the plurality of output terminals to the first potential or the second potential.

7. The voltage generating circuit of claim 4, wherein the first resistor ladder further comprises a switching element disposed at the second end, for electrically disconnecting the first end from the second end.

8. The voltage generating circuit of claim 4, wherein the second resistor ladder further comprises a switching element disposed at the first end, for electrically disconnecting the first end from the second end.

* * * * *